US012742807B2

(12) United States Patent
Kuo et al.

(10) Patent No.: US 12,742,807 B2
(45) Date of Patent: Sep. 22, 2026

(54) SYSTEM AND METHOD FOR MEASUREMENT OF RADIO FREQUENCY SIGNAL PATTERN USING PLANE WAVE

(71) Applicant: YTTEK TECHNOLOGY CORP., Hsinchu County (TW)

(72) Inventors: Fang-Yao Kuo, Hsinchu County (TW); Wen-Chiang Chen, Hsinchu City (TW); Hao-Ju Huang, Taoyuan City (TW)

(73) Assignee: YTTEK TECHNOLOGY CORP., Hsinchu County (TW)

( * ) Notice: Subject to any disclaimer, the term of this patent is extended or adjusted under 35 U.S.C. 154(b) by 52 days.

(21) Appl. No.: 18/731,423

(22) Filed: Jun. 3, 2024

(65) Prior Publication Data

US 2024/0410924 A1 Dec. 12, 2024

Related U.S. Application Data

(60) Provisional application No. 63/506,989, filed on Jun. 8, 2023.

(51) Int. Cl.
*G01R 29/08* (2006.01)
*G01R 29/10* (2006.01)

(52) U.S. Cl.
CPC ..... *G01R 29/0821* (2013.01); *G01R 29/0871* (2013.01); *G01R 29/0878* (2013.01); *G01R 29/0892* (2013.01); *G01R 29/10* (2013.01)

(58) Field of Classification Search
CPC ............ G01R 29/0821; G01R 29/0871; G01R 29/0878; G01R 29/0892; G01R 29/10; H01Q 15/14; H01Q 15/148; H04B 7/06; H04B 7/0617
See application file for complete search history.

(56) References Cited

U.S. PATENT DOCUMENTS

| | | | | |
|---|---|---|---|---|
| 2013/0093447 A1* | 4/2013 | Nickel | .................. | G01R 29/10 324/750.16 |
| 2018/0321292 A1* | 11/2018 | Bartko | ............... | G01R 29/0821 |
| 2019/0101579 A1* | 4/2019 | Rowell | .............. | G01R 29/0871 |
| 2019/0302184 A1* | 10/2019 | Rowell | .............. | G01R 31/2813 |
| 2021/0148958 A1* | 5/2021 | Abadie | .............. | G01R 29/0871 |

(Continued)

OTHER PUBLICATIONS

BWant Co. Ltd., Screenshots of Product demonstration video of mmWave OTA. (Year: 2021).*

(Continued)

*Primary Examiner* — Alexander H Taningco
*Assistant Examiner* — Anna N Hamadyk
(74) *Attorney, Agent, or Firm* — WPAT, P.C.; Anthony King

(57) ABSTRACT

A system for measuring a signal pattern includes: a first reflector including a first reflector surface configured to generate a plane wave; a second reflector including a second reflector surface configured to generate a plane wave; a path-guiding member coupled to the first reflector and the second reflector, and configured to move the first reflector and the second reflector along a predetermined path; a stage configured to hold a device under test (DUT); and a first signal transceiver configured to transmit a signal to, or receive the signal from, at least one of the first reflector, the second reflector and the DUT.

20 Claims, 22 Drawing Sheets

(56) References Cited

U.S. PATENT DOCUMENTS

| | | | | |
|---|---|---|---|---|
| 2022/0029714 | A1* | 1/2022 | Sorbel | G01R 29/0821 |
| 2024/0125833 | A1* | 4/2024 | Stuhlfauth | H04B 7/0617 |

OTHER PUBLICATIONS

Trichopoulos et al., Design and evaluation of reconfigurable intelligent surfaces in real-world environment (Year: 2021).*

Inder J. Gupta and Kurt P. Ericksen, "A Method to Design Blended Rolled Edges for Compact Range Reflectors", IEEE Transaction on Antennas and Propagation, 1990.

L. Gurel and H. Bagci, "Validation through comparison: Measurement and calculation of the bistatic radar cross section of a stealth target", Radio Science, 2003.

C. Beaudoin and T. Horgan, "Fully Polarimetric Bistatic Radar Calibration With Modified Dihedral Objects", IEEE Transaction on Antennas and Propagation, 2018.

D. Escot-Bocanegra and D. Poyatos-Martinez, "Spherical Indoor Facility Applied to Bistatic Radar Cross Section Measurements", Progress in Electromagnetic Research Letters, 2011.

Screenshots in a product demonstration video by BWant Co. Ltd (https://www.youtube.com/watch?v=Q8wz7YRdu6Q).

Screenshots in a product demonstration video by TRC Co. Ltd (https://www.youtube.com/watch?v=zA4wUhd3kx8).

Office Action issued by TIPO dated Feb. 17, 2025 for TW113120536.

English translation of the Search Report appended to Office Action issued by TIPO dated Feb. 17, 2025 for TW113120536.

Brief English translation of the Office Action issued by TIPO dated Feb. 17, 2025 for TW113120536.

* cited by examiner

114

SYSTEM AND METHOD FOR MEASUREMENT OF RADIO FREQUENCY SIGNAL PATTERN USING PLANE WAVE

PRIORITY CLAIM AND CROSS-REFERENCE

This application claims priority to U.S. provisional application Ser. No. 63/506,989 filed Jun. 8, 2023, the disclosure of which is hereby incorporated by reference in its entirety.

TECHNICAL FIELD

The present disclosure relates to a system and a method for radio-frequency (RF) signal pattern measurement, and more particularly, to a system and a method for RF signal pattern measurement using plane waves.

BACKGROUND

Wireless transmission technologies have progressed rapidly and are widely used in modern fixed and portable transmission equipment. The bandwidth and frequency of the transmitted signal are increased for pursuing improved performance, and therefore transmission equipment with a greater scale is required to compensate for the loss at a higher frequency, which would inevitably incur higher design and manufacturing cost. To ensure that the manufactured device, such as antennas, meets the design specification, the measurement accuracy and inclusiveness of the transmitted or received signal pattern plays an important role. However, as the measurement system has been developed for many years, there are still many deficiencies that need to be addressed, e.g., an efficient and accurate measurement system suitable for various application scenarios of modern wireless transmission. Therefore, there is a need to develop new architectures to fulfill the requirements of a measurement framework for signal patterns in wireless communication applications.

SUMMARY

According to embodiments of the present disclosure, a system for measuring a signal pattern includes: a first reflector including a first reflector surface configured to generate a plane wave; a second reflector including a second reflector surface configured to generate a plane wave; a path-guiding member coupled to the first reflector and the second reflector, and configured to move the first reflector and the second reflector along a predetermined path; a stage configured to hold a device under test (DUT); and a first signal transceiver configured to transmit a signal to, or receive the signal from, at least one of the first reflector, the second reflector and the DUT.

According to embodiments of the present disclosure, a method for measuring a signal pattern includes: disposing a device under test (DUT) on a stage; coupling a first reflector and a second reflector to a path-guiding member, wherein each of the first reflector and the second reflector is configured to be moved along a predetermined path defined by the path-guiding member, and includes a reflector surface configured to generate a plane wave; transmitting a first signal from a first one of the DUT, the first reflector and the second reflector; and in response to the transmitted first signal, receiving a reflected signal from a second one of the DUT, the first reflector and the second reflector.

Through the proposed signal pattern measurement system and method, the accuracy and efficiency of the measurement can be greatly improved. Further, the measurement work for various application scenarios can be simplified by the proposed measurement system. Therefore, the cost and time of RF signal pattern measurement can be saved.

BRIEF DESCRIPTION OF THE DRAWINGS

Details and features of the present disclosure are provided in the following description, and are presented in combination with the accompanying figures for ease of understanding. It should be noted that, in accordance with common practice, some features are not drawn to scale. Please bear in mind while viewing the figures that dimensions of various features may be arbitrarily increased or reduced for clarity of discussion.

DETAILED DESCRIPTION

Figure 1A:
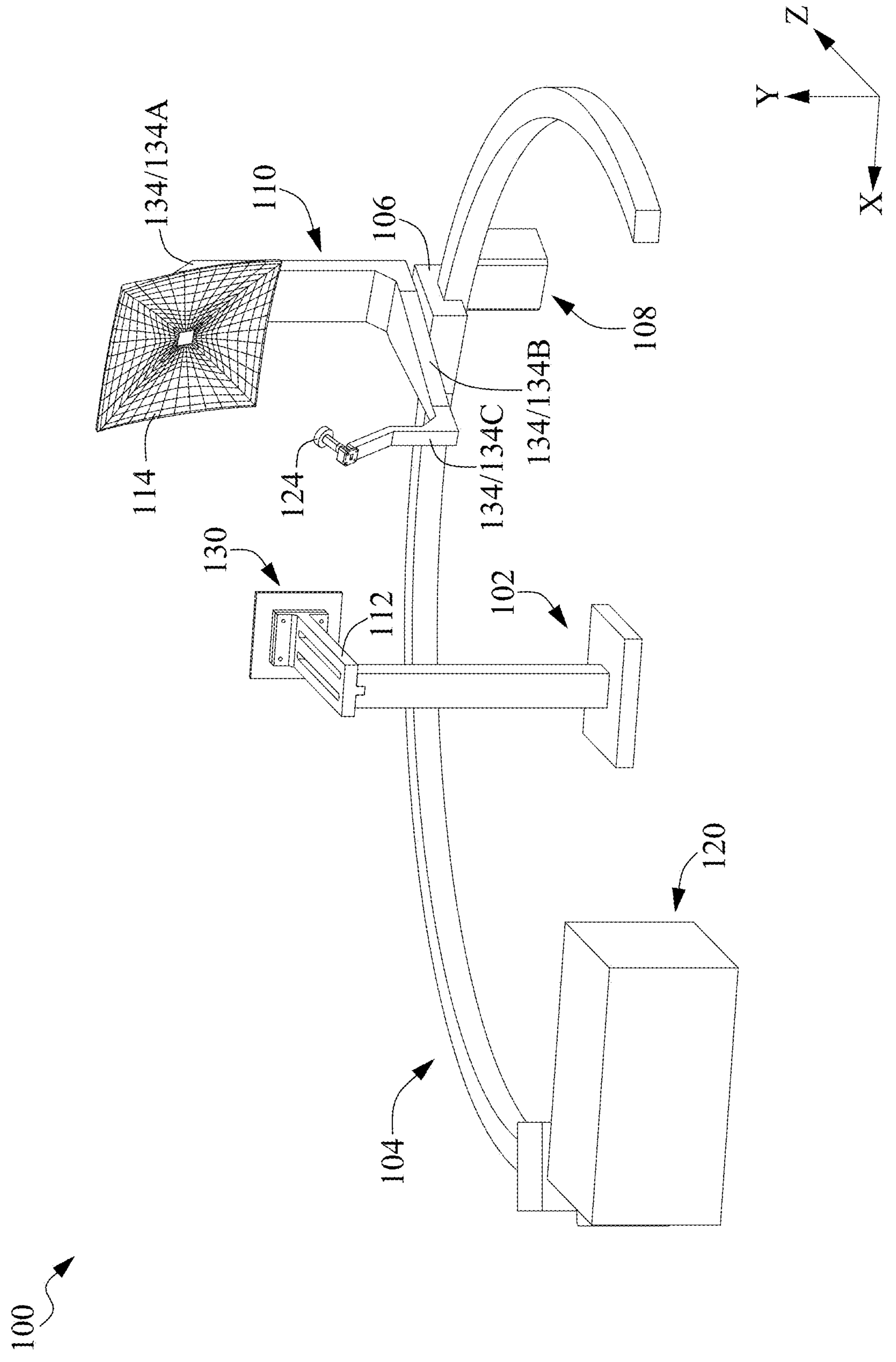
FIG. 1A is a perspective view of a radio frequency (RF) signal pattern measurement (RFSPM) system, in accordance with some embodiments of the present disclosure.

The following disclosure provides many different embodiments, or examples, for implementing different features of the provided subject matter. Specific examples of components and arrangements are described in the present disclosure in order to facilitate understanding of the invention. Such examples are merely provided to aid in understanding and are not intended to limit the present disclosure.

For example, the formation of a first feature over or on a second feature as described herein may include embodiments in which the first and second features are formed in direct contact, and may also include embodiments in which additional features are formed between the first and second features, such that the first and second features are not in direct contact. In addition, the present disclosure may repeat reference numerals and/or letters in the various examples. Such repetition is for the purpose of simplicity and clarity and does not necessarily indicate a relationship between the various embodiments and/or configurations described.

Further, spatially relative terms, such as “beneath,” “below,” “lower,” “above,” “upper” and the like, may be used herein for ease of description to describe one element or feature's relationship to another element(s) or feature(s) as illustrated in the figures. Such spatially relative terms are intended to encompass different orientations of the device in use or operation in addition to the orientation depicted in the figures. The apparatus may be otherwise oriented (for example, rotated 90 degrees from the depicted orientation) and the spatially relative descriptors used herein should accordingly be interpreted as including other orientations.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms “about,” “approximately” or “substantially” may mean within some small percentage of a given value or range. Alternatively, the terms “about,” “approximately” or “substantially” mean within an acceptable standard error of the value indicated when considered by one of ordinary skill in the art. Unless expressly specified otherwise, all of the numerical ranges, amounts, values and percentages such as those for quantities of materials, durations of time, temperatures, operating conditions, ratios of amounts, and the likes thereof disclosed herein should be understood as modified in all instances by the terms “about,” “approximately” or “substantially.” Accordingly, unless indicated otherwise, the numerical parameters set forth in the present disclosure and attached claims are approximations that can vary. At the very least, each numerical parameter should be construed in light of the number of reported significant digits and by applying ordinary rounding techniques. Ranges are expressed herein as from one endpoint to another endpoint, or as between one endpoint and another endpoint. All ranges disclosed herein are inclusive of the endpoints, unless specified otherwise.

As used herein, the term “connected” may be construed as “electrically connected,” and the term “coupled” may also be construed as “electrically coupled.” “Connected” and “coupled” may also be used to indicate that two or more elements cooperate or interact with each other. The terms “couple” or “connect” used throughout the present disclosure may also refer to physical or electrical linkage between two or more objects. These objects may also be referred to as being “coupled” or “connected” through exchange of data or information. These “coupled” or “connected” objects may be in direct contact in some cases or indirect contact through other intervening objects.

Embodiments of the present disclosure discuss a system and a method for RF signal pattern measurement. The system and the method provide a multi-function platform for measuring the gain/phase pattern of the transmission and/or receiving RF signals for a device under test (DUT) under different application scenarios. The system can be applied to the scenario of a measurement of an antenna gain/phase pattern for a DUT in transmission or reception. The system can also be applied to the scenario of a measurement of a gain/phase pattern in a scattering or specular reflection for a DUT in reflecting an incident RF signal. Further, the system is capable of emulating communications between a ground station and multiple low earth orbit (LEO) satellites.

In the proposed framework a plane wave is generated as medium of measurement for improving the accuracy of measurement, either in the gain pattern or the phase pattern. Moreover, the DUT can include a wide variety of application fields, such as passive antenna components, active antennas, reconfigurable intelligent surface (RIS), or other popular active or passive RF transmission devices. Therefore, the measurement framework across different testing specifications and application scenarios can be accomplished by the unified measurement system of the present disclosure. A great amount of measurement time and cost can thus be saved.

FIG. 1A is a perspective view of a radio frequency (RF) signal pattern measurement (RFSPM) system 100, in accordance with some embodiments of the present disclosure. The RFSPM system 100 includes a stage 102, a sliding track 104, a sliding block 106, a motor 108, a reflector 110, and a transceiver 120. The RFSPM system 100 further includes a device under test (DUT) 130 serving as a workpiece for the RFSPM system 100. The DUT 130 can include a variety of devices for transmitting or receiving RF signals, e.g., a passive antenna components, an active antenna, a reconfigurable intelligent surface (RIS), an antenna array, an active electronically scanned array, or other popular active or passive RF transmission/receiving devices. Although FIG. 1A only illustrates the abovementioned components of the RFSPM system 100, the present disclosure is not limited thereto, and the RFSPM system 100 can include more or less components in other embodiments.

Figure 1B:
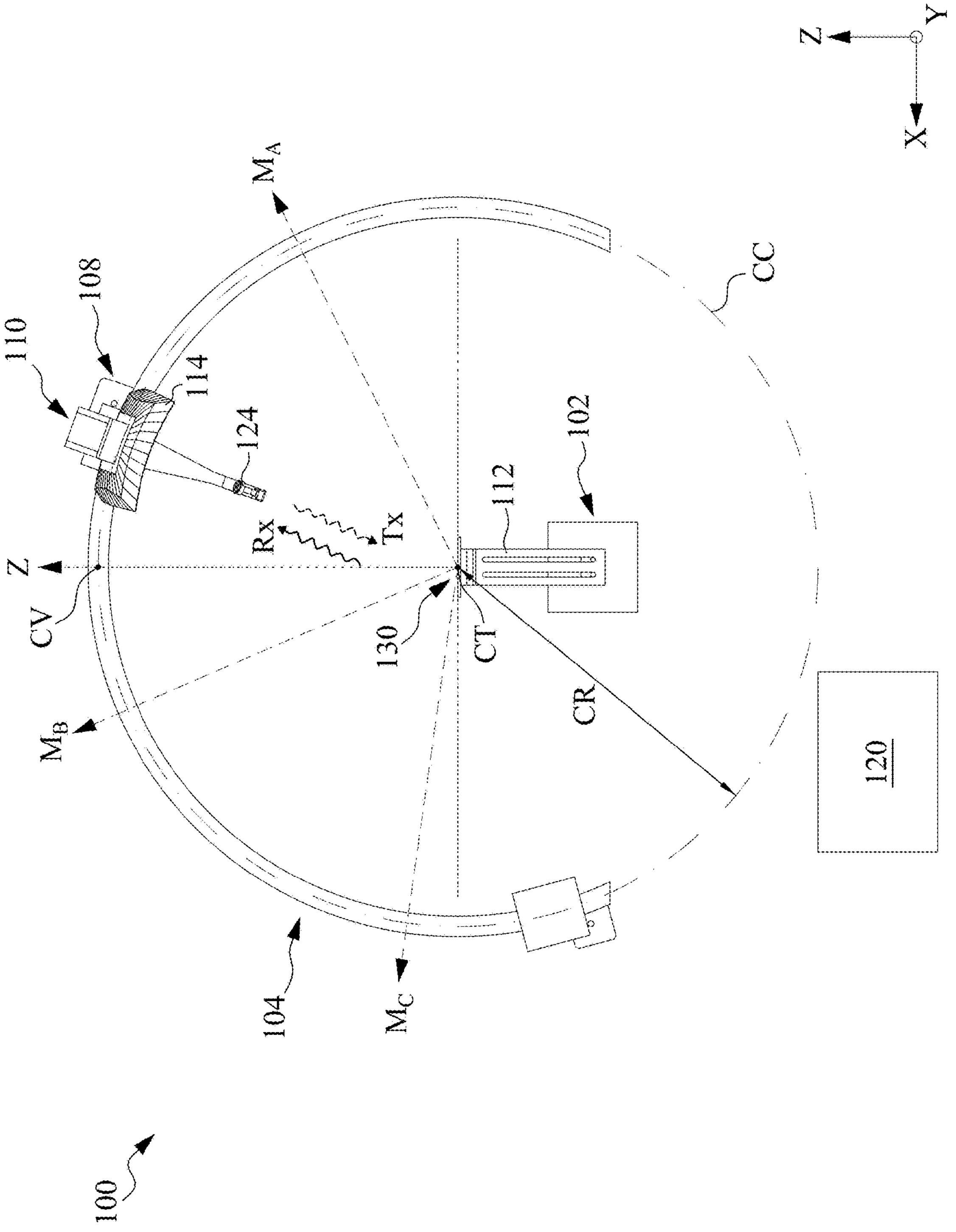
FIG. 1B is a top view of the RFSPM system shown in FIG. 1A, in accordance with some embodiments of the present disclosure.

FIG. 1B is a top view of the RFSPM system 100 shown in FIG. 1A, in accordance with some embodiments of the present disclosure. Referring to FIGS. 1A and 1B, the RFSPM system 100 is disposed on a center of a hypothetical circle CC with a center CT and a radius CR associated with the hypothetical circle CC. The hypothetical circle CC is used as reference coordinates in the RFSPM system 100 such that all of the RF signals are configured to point to or point away from the center CT, and to be transmitted, reflected or received at the center CT. Further, the hypothetical circle CC has a vertex CV at a top of the hypothetical circle CV. The position and the location of the RFSPM system 100 is located via a Cartesian coordinate system with an X-axis, a Y-axis and a Z-axis perpendicular to each other. The center CT of the hypothetical circle CC overlaps the origin of the Cartesian system, while the vertex CV overlaps the Z-axis. This coordinate arrangement of the hypothetical circle CC can simplify the calculation of various kinds of angles, such as incident angles, reflection angles, transmitting angles or receiving angles of a testing RF signal. To this end, the stage 102 is disposed near the center CT of the RFSPM system 100. The stage 102 may be configured to hold the DUT 130 and keep the DUT 130 fixed during a measurement operation. In some embodiments, referring to FIG. 1A, the stage 102 includes a pedestal, a post disposed on the pedestal, and a track 112 disposed on a top portion of the post, in which the track 112 is configured to hold the DUT 130. The track 112 may be a retractable track configured to move the DUT 130 forward and backward in a direction of Z-axis. In some embodiments, the track 112 includes slots extending through the Y-axis and along the Z-axis. The stage 102 includes one or more clamping members or fasteners (not separately shown) extending from the top portion of the post of the stage 102 and fastening the track 112 via the slots. When the clamping members or fasteners are loosened, the track 112 can be moved freely in a direction restricted by the clamping members or fasteners in the slots. The track 112 may be used to adjust a location of a transmitting/receiving end/surface or a reflective end/surface of the DUT 130, such that the transmitting/receiving or reflective end/surface of the DUT 130 is at least partially aligned with the X-axis, or passes through or cross the center CT of the RFSPM system 100, thereby causing the testing signal can be transmitted, reflected or received at the center CT. In some embodiments, the transmitting/receiving or the reflective end/surface of the DUT 130 is arranged to be symmetrical with respect to the center CT. In some embodiments, the DUT 130 is arranged to face the vertex CV. After the location adjustment of the DUT 130 is completed, the clamping members or fasteners are fastened to fix the DUT 130 in place. Throughout the present disclosure, the transmitting/receiving or the reflective end/surface of the DUT 130, which is the to-be-measured surface during the testing operation, is collectively referred to a target surface of the DUT 130.

In some embodiments, the RFSPM system 100 includes a sliding track 104 arranged following a predetermined circular path of a perimeter of the hypothetical circle CC. The sliding track 104 may have a shape of an arc following the circular path of the perimeter of the hypothetical circle CC. In some embodiments, the sliding track 104 extends at least one half of the path of the perimeter of the hypothetical circle CC, i.e., a semicircle. The sliding track 104 usually extends beyond a semicircle to facilitate emulation of the RFSPM system 100 for different application scenarios, as are discussed in following paragraphs. The arc-shaped tracking slide 104 is formed following the path of the hypothetical circle CC to ensure that the reflector 110 moves along the path of the hypothetical circle CC. Taking the direction of positive X-axis as an angle reference of zero degrees (see FIG. 1C), any location on the path of the hypothetical circle CC corresponds to a specific angle with respect to the angle reference of zero degrees. Therefore, when an RF signal is transmitted, reflected or received in a specific location on the path of the hypothetical circle CC, such location will readily correspond to a specific incident angle or reflection angle, thereby simplifying the angle derivation process in the repeated signal measurement operations.

In some embodiments, the RFSPM system 100 further includes a sliding block 106 attached to the sliding track 104. The reflector 110 can be detachably mounted on the sliding block 106 and fixed on the sliding block 106. The sliding block 106 is configured to carry the reflector 110 to slide freely on the sliding track 104. The sliding block 106 may also be configured to cause the reflector 110 to stop at a specific location of the sliding track 104 such that the testing signal can be transmitted, received and analyzed or recorded with sufficient time during a signal measurement operation. The sliding block 106 may alternatively be configured to cause the reflector 110 to move at a predetermined speed on the sliding track 104 to emulate a transmitter or receiver in motion. In some embodiments, the sliding block 106 may include a C-shape or a ring shape in its cross section to surround at least three sides of the sliding track 104.

The stage 102, the sliding track 104, and the sliding block 106 may be formed of a rigid material, such as metal, plastics, stainless, glass, or other suitable rigid materials. Although FIG. 1A shows that the stage 102 and the sliding track 104 have a rectangular cross-section along a direction perpendicular to the direction in which the stage 102 or the sliding track 104 extends, the present disclosure is not limited thereto. Other shapes or configurations of cross-sections of the stage 102 or the sliding track 104 are also within the contemplated scope of the present disclosure.

As discussed previously, in some embodiments, the sliding track 104 is used to move the reflector 110 along the arced path of the perimeter of the hypothetical circle CC. However, the present disclosure is not limited thereto, any guiding mechanism that can carry the reflector 110 and guide the reflector 110 to move on the circular path of the perimeter of the hypothetical circle CC is also within the contemplated scope of the present disclosure. Throughout the present disclosure, the sliding track 104 may also be referred to as one kind of a "path-guiding member."

In some embodiments, the motor 108 is coupled to the sliding block 106. The motor 108 is configured to provide motion force to the sliding block 106 and drive the sliding block 106 to move along the sliding track 104. Although not shown, the RFSPM system 100 may include a unit formed of gears or toothed racks coupled between the motor 108 and the sliding block 106 for applying the driving force from the motor 108 to the sliding block 106. The reflector 110 can thus be moved by the motor 108 through the sliding block 106 accordingly. The motor 108 may include a servo motor, such as a direct-current (DC) servo motor, an alternating-current (AC) servo motor, a rotary servo motor, a linear servo motor, or the like.

In some embodiments, the reflector 110 includes a reflector surface 114, a transceive antenna 124 and a cantilever bracket 134. The cantilever bracket 134 is configured to support and hold the reflector surface 114 and the transceive antenna 124. The cantilever bracket 134 may include a first arm 134A, a second arm 134B and a third arm 134C connected to each other, wherein the first arm 134A is connected between the reflector surface 114 and the second arm 134B, the second arm 134B is coupled to the sliding block 106 between the first arm 134A and the third arm 134C, and the third arm 134C is connected between the transceive antenna 124 and the second arm 134B. In some embodiments, the cantilever bracket 134 is configured such that the reflector surface 114 is positioned at a same level as the transceive antenna 124, or positioned at a higher location than that of the transceive antenna 124, to facilitate transmission or reception of the testing signal.

In some embodiments, the transceiver 120 is electrically coupled to a signal transmitter and a signal receiver, e.g., the transceive antenna 124 or the DUT 130, and a signal receiver, e.g., the transceive antenna 124 or the DUT 130. The transceiver 120 may be configured to generate an RF signal as the testing signal and transmit the RF signal to the signal transmitter. The transceiver 120 may also receive the RF signal from the signal receiver. Throughout the present disclosure, a meandering arrow line (see FIG. 1B for example) refers to a transmission direction of an RF signal, in which a label "Tx" shown near one end of the meandering arrow line denotes that such RF signal is transmitted by the signal transmitter near the label "TX", while a label "RX" shown near the meandering arrow line denotes that such RF signal is received by the receiver near the label "RX".

In some embodiments, the transceiver 120 may be electrically connected to a signal generator and a signal analyzer (both not separately shown) for respectively providing RF signal data and recording the gain data of the testing signal. In some embodiments, the transceiver 120 may embed the signal generator and the signal analyzer (not separately shown). In some other embodiments, the transceiver 120 further includes more equipment for performing RF signal generation or analysis, e.g., a vector network analyzer, a software defined radio, and the like. In some embodiments, the vector network analyzer or the software defined radio is configured to capture and record the phase data of the testing signal.

In some embodiments, the RFSPM system 100 is applicable to RF signal pattern measurement of an antenna or any other active RF devices with an excitation source. Each of the reflector 110 (or equivalently the transceive antenna 124) or the DUT 130 can serve as a signal emitter/transmitter, or a signal receiver of the testing RF signal during the signal pattern measurement operation. When the reflector 110 serves as the signal transmitter, the DUT 130 would serve as the signal receiver. Similarly, when the DUT 130 serves as the signal transmitter, the reflector 110 would serves as the signal receiver. In other words, the reflector 110 and the DUT 130 form a transmission/reception pair of the testing RF signal. In some embodiments, when the DUT 130 serves as the receiver, the testing RF signal is used to measure the receive RF signal (gain/phase) pattern of the DUT 130 via the reflector 110. Similarly, when the DUT 130 serves as the transmitter, the testing RF signal is used to measure the transmit RF signal (gain/phase) pattern of the DUT 130 via the reflector 110.

Before or at the beginning of the measurement operation, the DUT 130 is disposed on the track 112 of the stage 102. The track 112 is configured to carry and fix the DUT 130 on the stage 102. In some embodiments, a to-be-measured (target) surface of the DUT 130 is arranged to be aligned with or pass through the center CT of the hypothetical circle CC. The target surface of the DUT 130 may be arranged to be parallel to the X-axis and perpendicular to the Z-axis. The target surface of the DUT 130 may be arranged to face the vertex CV of the hypothetical circle CC. The track 112 can be configured to tune the location, the rotational angle and the orientation of the DUT 130. The reflector 110 and the DUT 130 are electrically connected to the transceiver 120, e.g., through a cable, a wire, or any other suitable connecting medium, to receive or transmit the testing RF signal. After the components of the RFSPM system are arranged in place, the measurement operation is started.

Figure 1C:
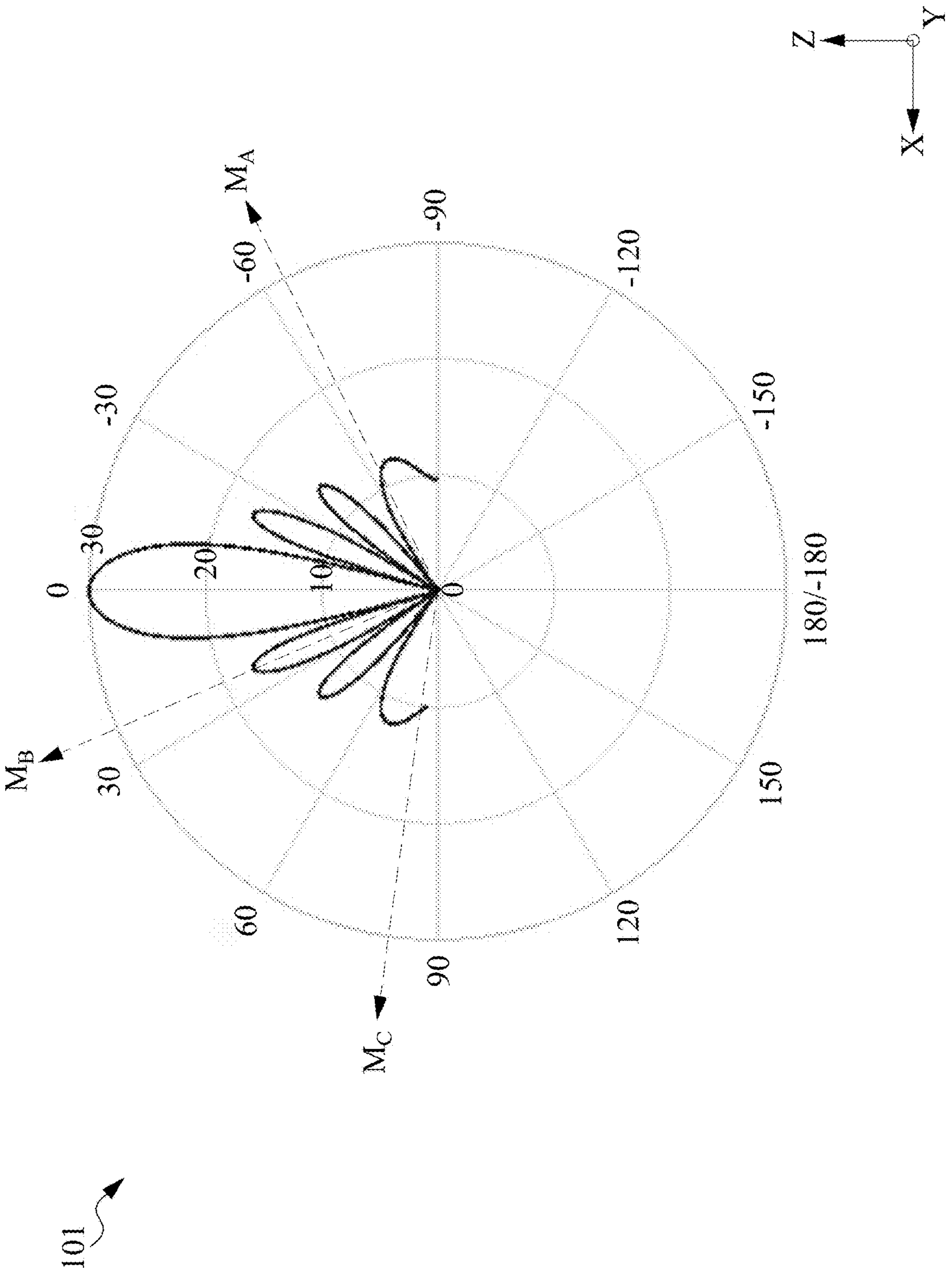
FIG. 1C is a diagram of an antenna gain pattern generated by the RFSPM system shown in FIG. 1A, in accordance with some embodiments of the present disclosure.

FIG. 1C is a diagram of an antenna gain pattern 101 generated by the RFSPM system 100 shown in FIGS. 1A and 1B, in accordance with some embodiments of the present disclosure. During operation, the antenna pattern 101 is generated by a plurality of testing signal measurement operations carried out with the reflector 110 moving on the sliding track 104 from a first end to a second end (e.g., from a right-side to a left-side end, or vice versa) of the sliding track 104. Along the predetermined path of the sliding track 104, the reflector 110 may be moved to stop at a plurality of measurement sites of the sliding track 104 successively. During the stay period at each of the plurality of measurement site, the transceiver 120 is configured to a generate a testing RF signal, and transmit the RF signal from the signal transmitter, e.g., the transceive antenna 124 or the DUT 130, to the signal receiver, e.g., the transceive antenna 124 or the DUT 130. The transceiver 120 is configured to receive the RF signal from the signal receiver and measure a gain/phase result of the RF signal.

For example, referring to FIGS. 1B and 1C, when the reflector 110 is moved to stop at the three measurement sites $M_A$, $M_B$ and $M_C$, three measurement operations are carried out, and three measurement results of gains of the RF signal are taken and plotted on the blank sheet of the antenna gain pattern 101 at the corresponding angles of the measurement sites $M_A$, $M_B$ and $M_C$. After a sufficient number of measurement operations along the sliding track 104 between the zero degrees and 180 degrees (or, alternatively, between −90 degrees and +90 degrees or other suitable ranges), measurements of the antenna gain pattern 101 at different angles are collected, and these measurements are connected together with an optionally smoothing operation. The antenna gain pattern 101 is acquired accordingly.

Figure 2A:
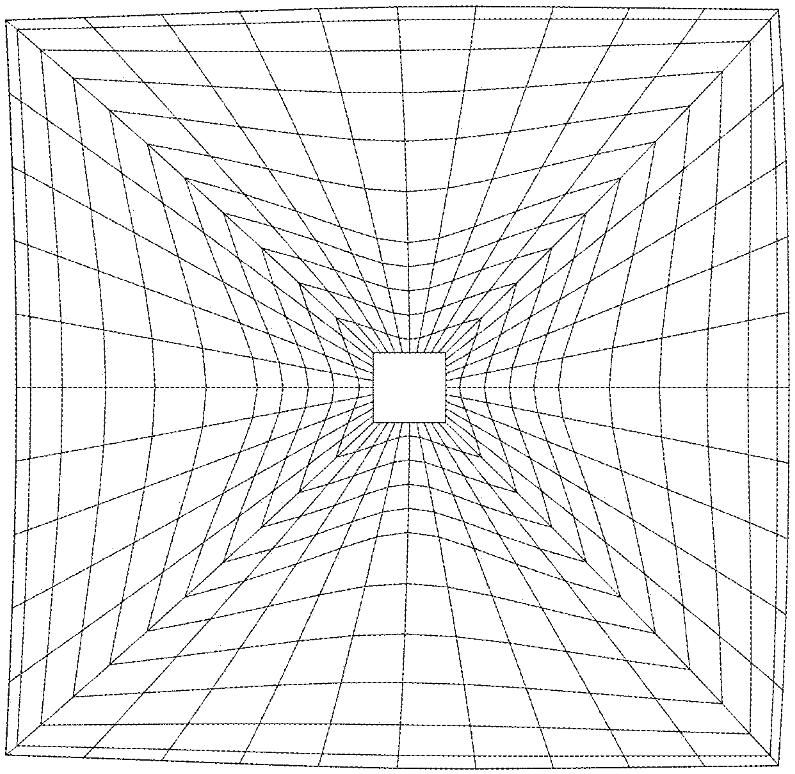
FIG. 2A is an enlarged top view of a reflector surface shown in FIG. 1A, in accordance with some embodiments.
Figure 2B:
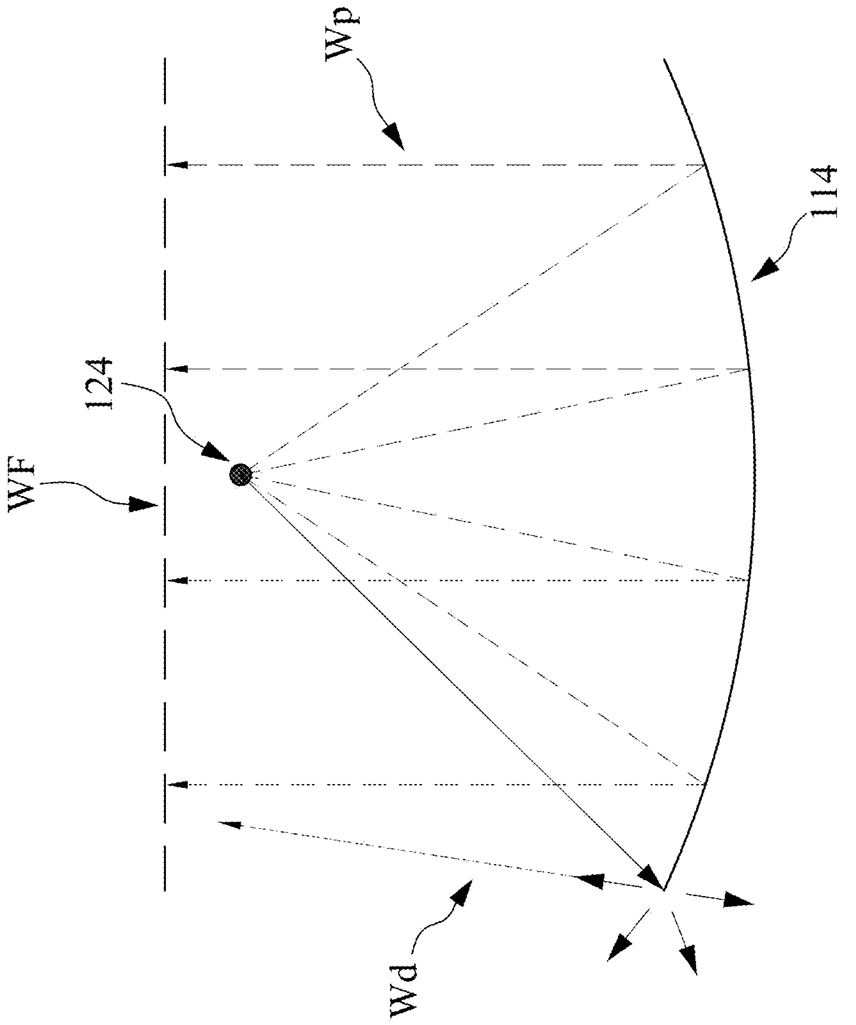
FIGS. 2B and 2C are block diagrams showing generation of a plane wave through the reflector surface shown in FIG. 2A, in accordance with some embodiments.
Figure 2C:
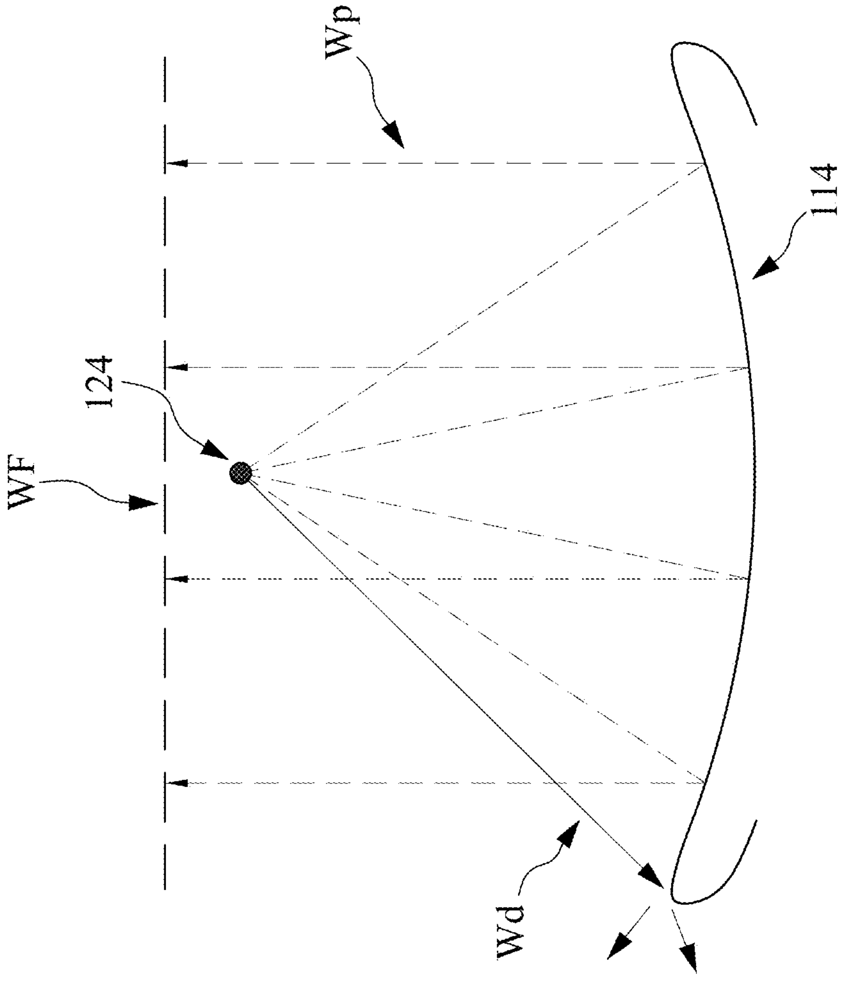

FIG. 2A is an enlarged top view of a reflector surface 114 shown in FIG. 1A, in accordance with some embodiments. In some embodiments, the reflector surface 114 is configured to convert a spherical wave of the incident RF signal into a plane wave. A plane wave may be defined as a wave having equal powers and equal phases at all locations of a viewing plane. The plane wave is equivalent or at least a good approximation to a far field region and can provide better measurement accuracy of the gain pattern and the phase pattern of the testing signal than a spherical wave. In some embodiments, to generate a substantially-planar plane wave, the reflector surface 114 includes a curved surface recessed at the center of the reflector surface 114. FIGS. 2B and 2C are block diagrams showing generation of plane waves through the reflector surface 114 shown in FIG. 2A, in accordance with some embodiments. As shown in FIGS. 2B and 2C, the reflector surface 114 includes a curved surface, such as a parabolic surface along a cross-section of the reflector surface 114. In some embodiments, the curved surface is a surface of a paraboloid. When the testing RF signal is emitted by the transceive antenna 124 toward the reflector surface 114, the RF signal is in a form of spherical waves. Due to the curved surface of the reflector surface 114, each of the rays or waves of the RF signal incident on the reflector surface 114 is reflected with substantial equal powers and phases, thereby forming a plane wave Wp with a substantially planar wavefront WF with respect to a direction in which the wave travels. All the rays emitted from the excitation source of the transceive antenna 124 to the location of the wavefront WF travel by equal distances, and therefore the rays of the plane wave Wp at the wavefront WF have equal powers and equal phases. In some embodiments, a reflection direction of the reflector surface 114 is configured to always point to the center CT during movement of the reflector 110 on the sliding track 104.

Figure 2D:
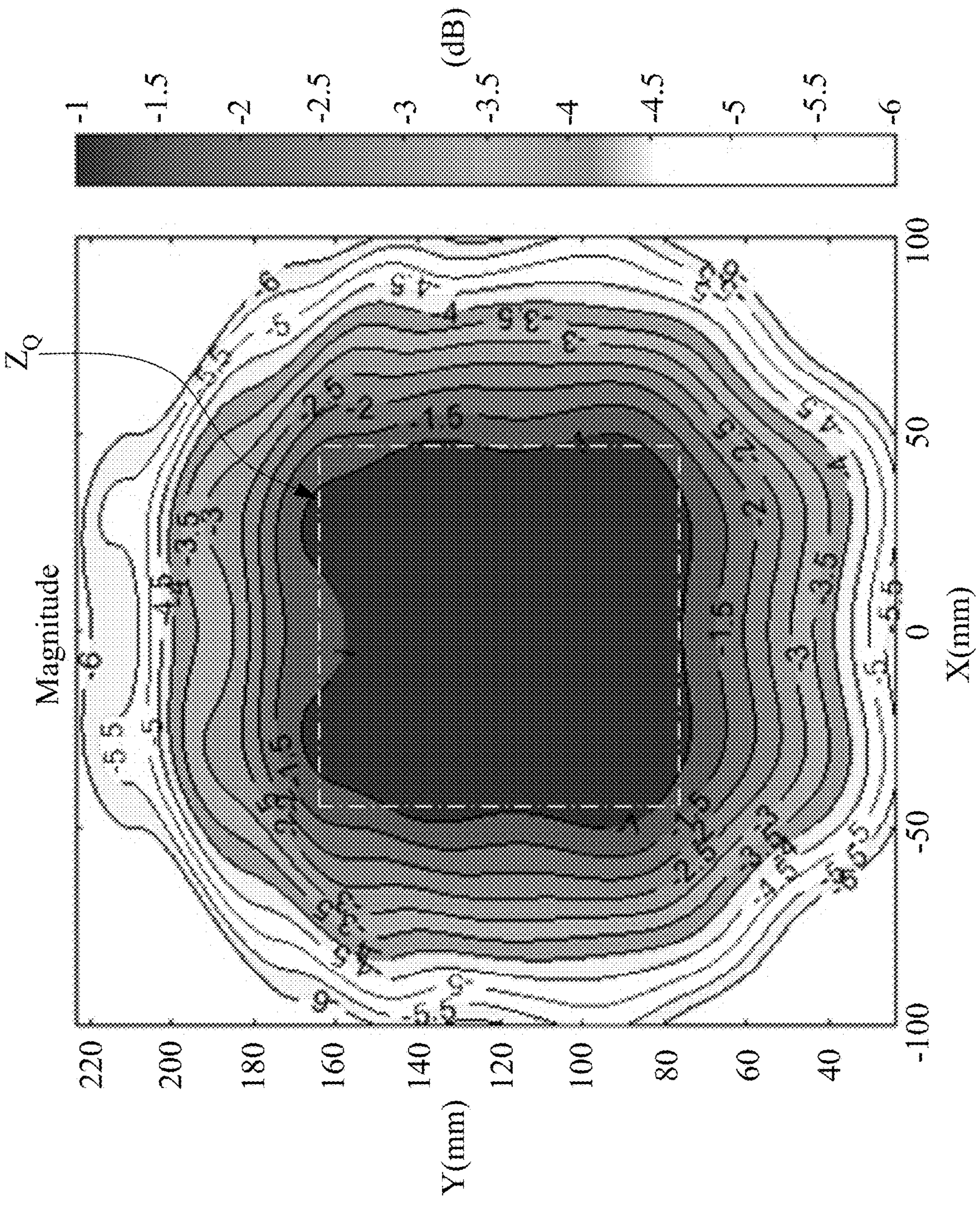
FIGS. 2D and 2E are a gain pattern and a phase pattern, respectively, of the reflector surface shown in FIG. 2A, in accordance with some embodiments.
Figure 2E:
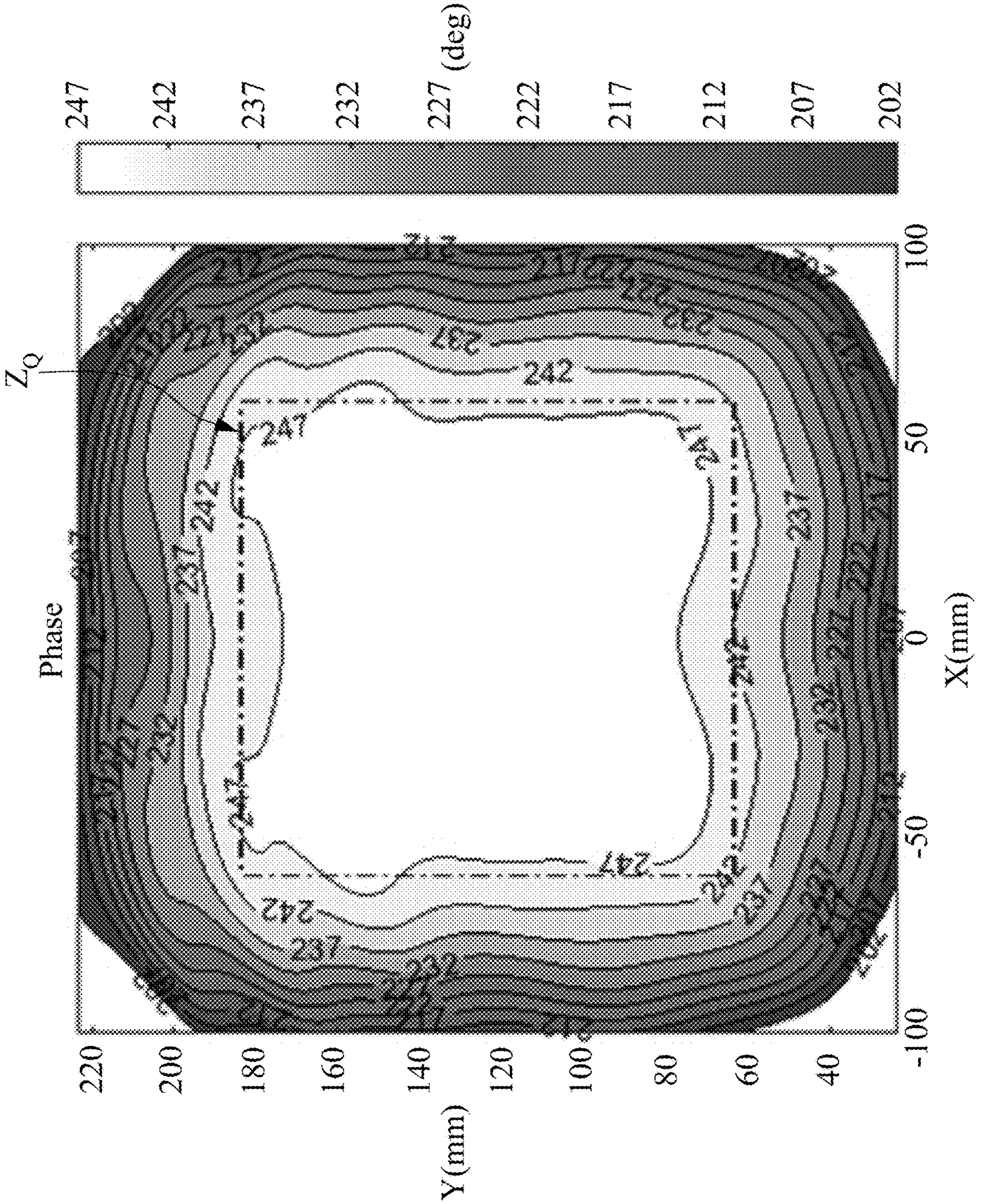

FIGS. 2D and 2E are a gain pattern and a phase pattern, respectively, of the reflector surface 114 shown in FIG. 2A, in accordance with some embodiments. The boundaries of the plots of FIGS. 2D and 2E correspond to the periphery of the reflector surface 114. The gain pattern and the phase pattern show the gain distribution and the phase distribution, respectively, in different reflective locations of the reflector surface 114. The gain pattern and the phase pattern are illustrated with a plurality of contour lines on which a gain value or phase value is labeled. According to some embodiments, due to physical and process constraints, the reflector surface 114 is not an ideal paraboloid, and the gain distribution and the phase distribution may not attain the ideal properties of equal powers and equal phases across the entire reflector surface 114. Similarly, according to some embodiments, the spherical wave generated by the transceiver antenna 124 is not an ideal spherical wave due to physical and process constraints, and the properties of the plane wave generated by the reflector surface 114 may be adversely impacted accordingly. As illustrated in FIGS. 2D and 2E, each of the gain pattern and the phase pattern has a zone near the center of the reflector surface 114 with a gain or phase variation less than that near the periphery of the reflector surface 114. In some embodiments, a quiet zone $Z_Q$ is defined around the center of the reflector surface 114, within which the gain variation and the phase variation are within a predetermined tolerance. For example, in the depicted example, within the scope of the quiet zone $Z_Q$, the gain variation tolerance is about 1 dB, and the phase variation tolerance is about 10 degrees.

Referring to FIGS. 2B and 2C, the difference between the reflector surface 114 in FIG. 2B and that in FIG. 2C is that the reflector surface 114 in FIG. 2B has sharp edges while the reflector surface 114 in FIG. 2C has rounded or curved edges. When the rays of the testing RF signal are incident on the edges of the paraboloid of the reflector surface 114 in FIG. 2B, wave diffraction or scattering will occur. The diffracted rays Wd might travel in a random direction and interfere with the plane waves Wp with the wavefront WF. The planar property of the plane wave Wp may thus be adversely affected. In contrast, with the rounded or curved edges, the scattered rays Wd of the testing RF signal reflected by the edges of the reflector surface 114 are guided to travel in directions different from that of the plane waves. Therefore, the plane wave property of the reflector surface 114 can be better preserved.

Figure 3A:
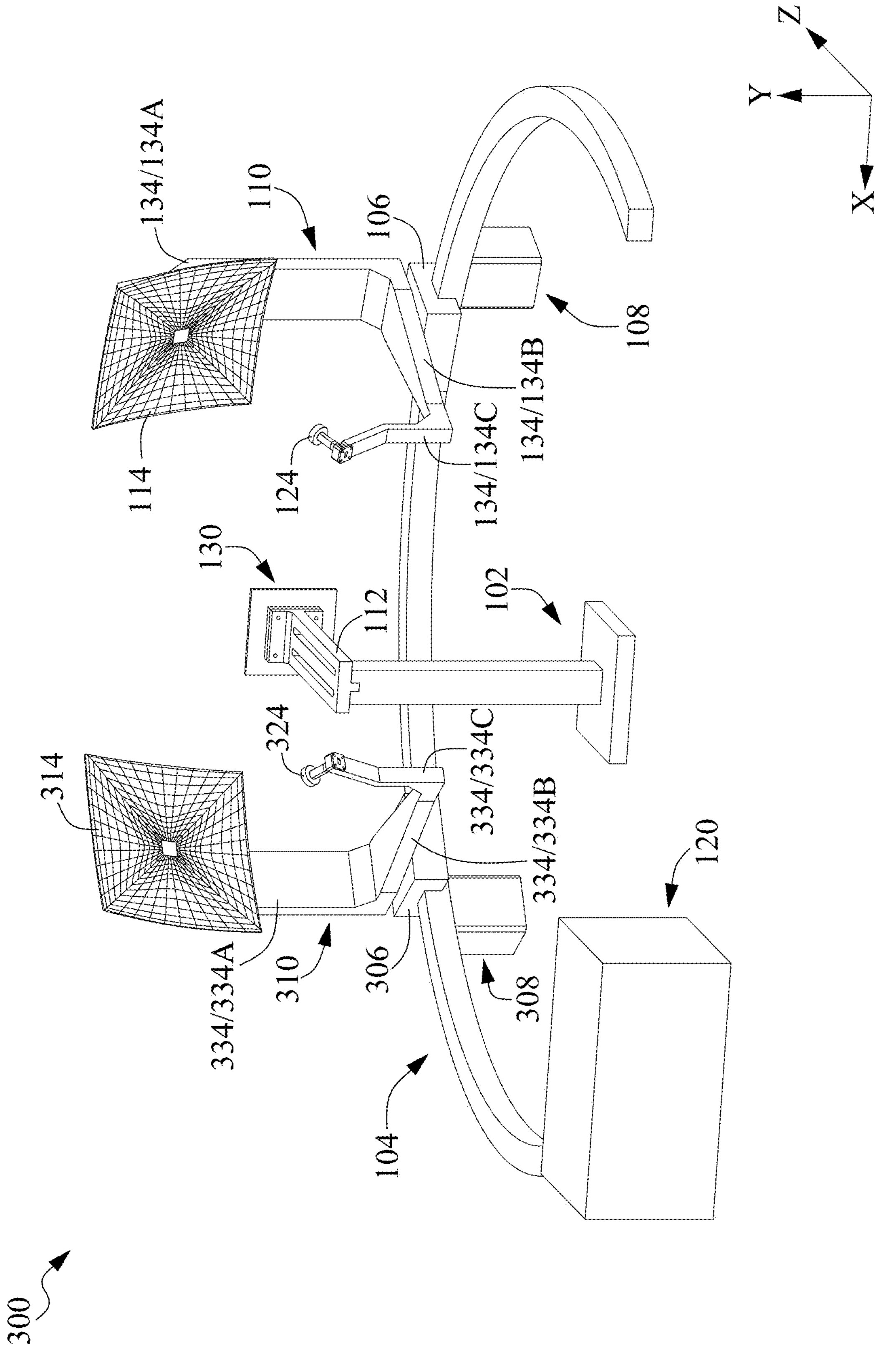
FIG. 3A is a perspective view of an RFSPM system, in accordance with some embodiments of the present disclosure.

FIG. 3A is a perspective view of an RFSPM system 300, in accordance with some embodiments of the present disclosure. The RFSPM system 300 is similar to the RFSPM system 100 in many aspects, and similar features are not repeated for brevity. The major difference between the RFSPM system 300 and the RFSPM system 100 is the introduction of another reflector 310, another sliding block 306 and another motor 308. In some embodiments, either the reflector 110 or the reflector 310 can be detachably mounted on the sliding block 306 over the sliding track 104, and removed from the sliding block 306 or moved back to a non-working area around the left/right-side end of the sliding track 104 depending upon various testing applications. The RFSPM system 300 can therefore be configured to perform RF signal pattern measurement operations of the DUT 130 via signal transmission and reception between the reflector 110 and the reflector 310 through the DUT 130.

In some embodiments, the reflector 310 is attachably mounted on a sliding block 306 and is driven by the motor 308 along the sliding track 104. The reflector 310 may include a reflector surface 314, a transceive antenna 324 and a cantilever bracket 334, in which the cantilever bracket 334 may include a first arm 334A, a second arm 334B and a third arm 334C connected to each other, wherein the first arm 334A is connected between the reflector surface 314 and the second arm 334B, the second arm 334B is coupled to the sliding block 306 between the first arm 334A and the third arm 334C, and the third arm 334C is connected between the transceive antenna 324 and the second arm 334B. In some embodiments, the cantilever bracket 334 is configured such that the reflector surface 314 is positioned at a same level as the transceive antenna 324, or positioned at a higher location than that of the transceive antenna 324, to facilitate transmission or reception of the testing signal.

Figure 3B:
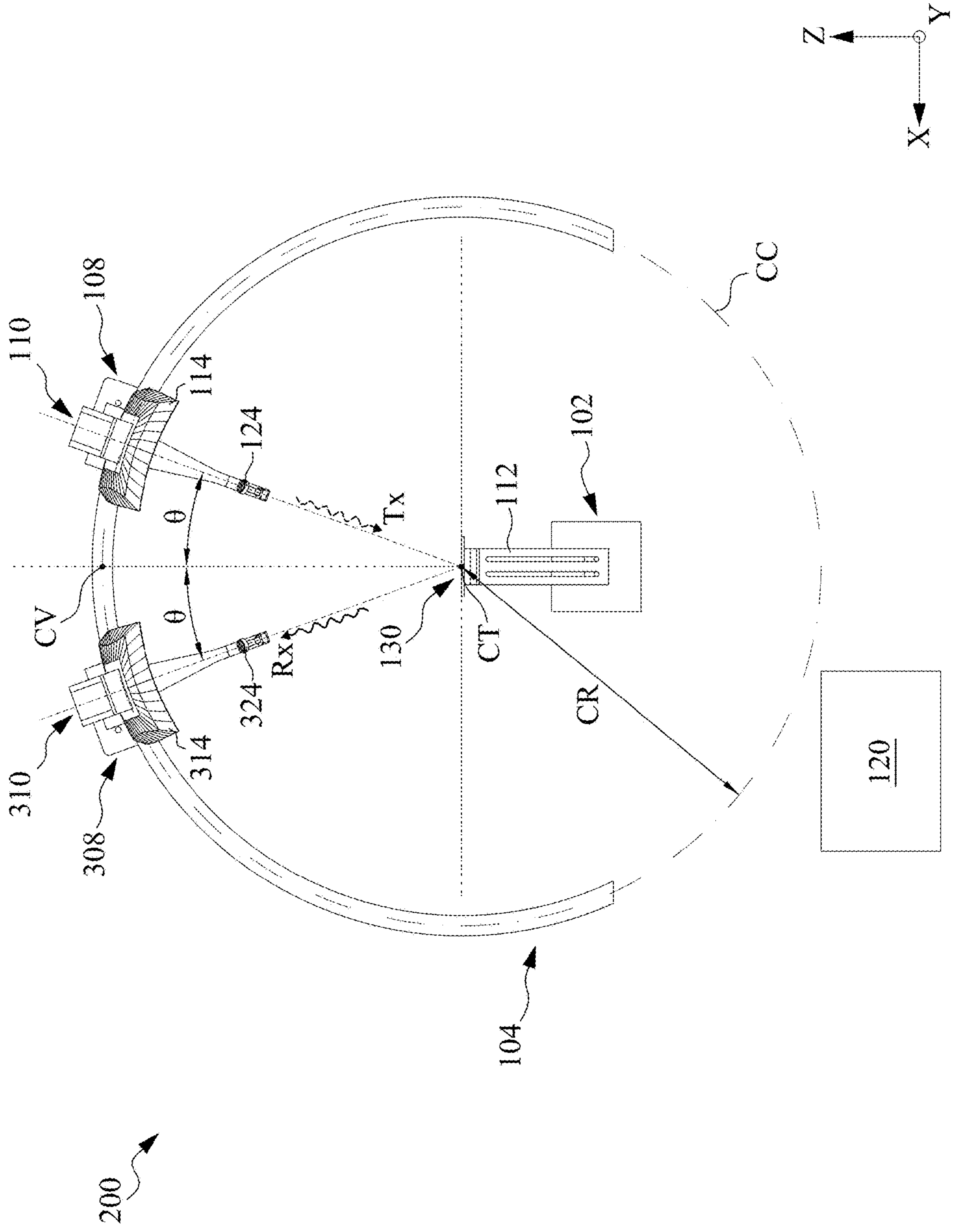
FIGS. 3B and 3C are top views of the RFSPM system shown in FIG. 3A, in accordance with some embodiments of the present disclosure.
Figure 3C:
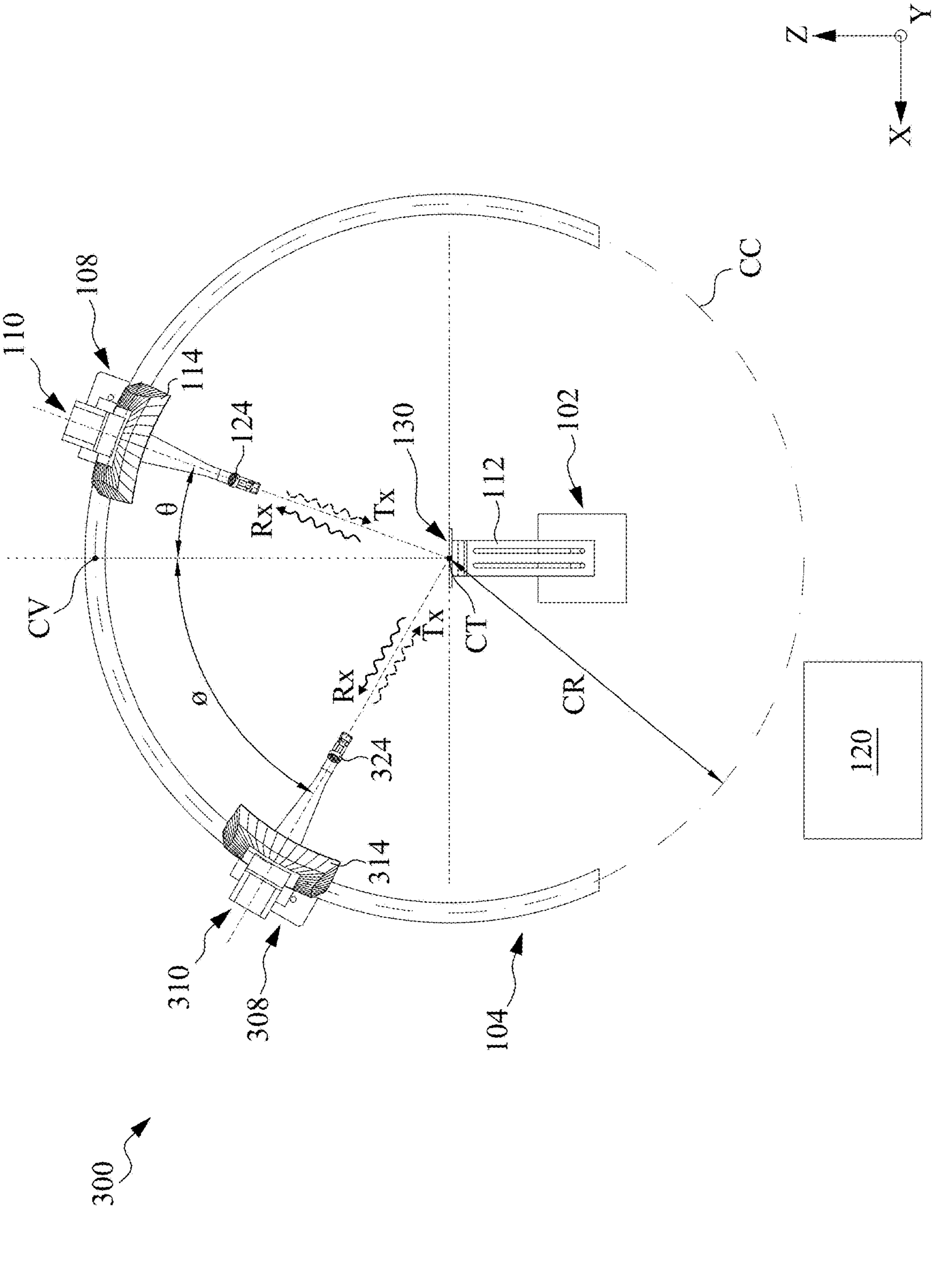

FIGS. 3B and 3C are top views of the RFSPM system 300 shown in FIG. 3A, in accordance with some embodiments of the present disclosure. In some embodiments, the RFSPM system 300 is applicable to measurement of an RIS device or a device without having an excitation source to determine a scattering distribution or bi-static radar cross section (RCS) of the DUT 130.

Referring to FIG. 3B or 3C, before or at the beginning of the measurement operation, the DUT 130 is disposed on the track 112 of the stage 102. The track 112 is configured to carry and fix the DUT 130 on the stage 102 in a way similar to that described with reference to FIG. 1B. Further, each of the reflectors 110 and 310 is electrically connected to the transceiver 120, e.g., through a cable, a wire, or any other suitable connecting medium, to receive or transmit the testing RF signal. In some embodiments, the DUT 130 is disconnected from the transceiver 120 during measurement of the scattering distribution or the RCS of the RIS device or the device without having an excitation source. After the components of the RFSPM system 300 are arranged in place, the measurement operation started.

During operation, referring to FIG. 3B, one of the reflectors 110 and 310 serves as the signal transmitter for transmitting the RF signal, and the other of the reflectors 110 and 310 serves as the signal receiver for receiving the RF signal via reflection of the DUT 130. In some embodiments, during the measurement operation at a predetermined measurement location, the reflectors 110 and 310 are positioned symmetrically with respect to the Z-axis. As a result, the incident angle θ and the reflection angle θ are equal. That would cause specular reflection of the testing RF signal through the reflective surface of the DUT 130 to be captured via the setup of the RFSPM system 300 shown in FIG. 3B. In some embodiments, under the assumption of symmetry property of the reflective surface of the DUT 130, the measurement work can be completed by measuring the signal pattern from zero degrees to 90 degrees and duplicating the measurement result of 0-90 degrees to that for 180-90 degrees.

During operation, referring to FIG. 3C, the setup of the reflectors 110 and 310 and the DUT 130 is similar to that described with reference to FIG. 3B for performing specular reflection measurement. The main difference between the measurement setup between FIG. 3B and FIG. 3C is that, during the measurement operation at a predetermined measurement location, the reflectors 110 and 310 are positioned non-symmetrically with respect to the Z-axis. As a result, the incident angle θ is unequal to the reflection angle ϕ. That would cause one or more scattering reflection of the testing RF signal through the reflective surface of the DUT 130 to be captured via the setup of the RFSPM system 300 shown in FIG. 3C. In some embodiments, the measurement work in FIG. 3C takes more measurement location pairs than those taken in the measurement work in FIG. 3B since for a specific location of the reflector 110 serving as the signal transmitter, the receiving location may need to be scanned from 90 degrees to 180 degrees, and the actual measurement count depends upon the requirement of pattern resolution of the gain/phase pattern. Further, the surface topography of reflective surface of the DUT 130 may not be symmetrical with respect to the Z-axis in terms of scattering reflection. Thus, a complete scan from zero degrees to 180 degrees (or, alternatively, from −90 degrees to +90 degrees or other suitable ranges) for the reflector 110 may be necessary to acquire the complete scattering (gain/phase) pattern of the DUT 130 for any incident angles.

The proposed RFSPM system 300 provides advantages. Existing measurement systems can only provide the measurement result in a near-field region when the DUT 130 is an RIS. Therefore, the accurate RIS performance in a far-field region can't be assessed accurately during the testing phase. In contrast, the propose RFSPM system 300 can support the plane waves to emulate the far-field region of the RIS. As a result, the reflective gain/phase pattern of the RIS can be assessed more thoroughly during the testing phase.

Figure 4:
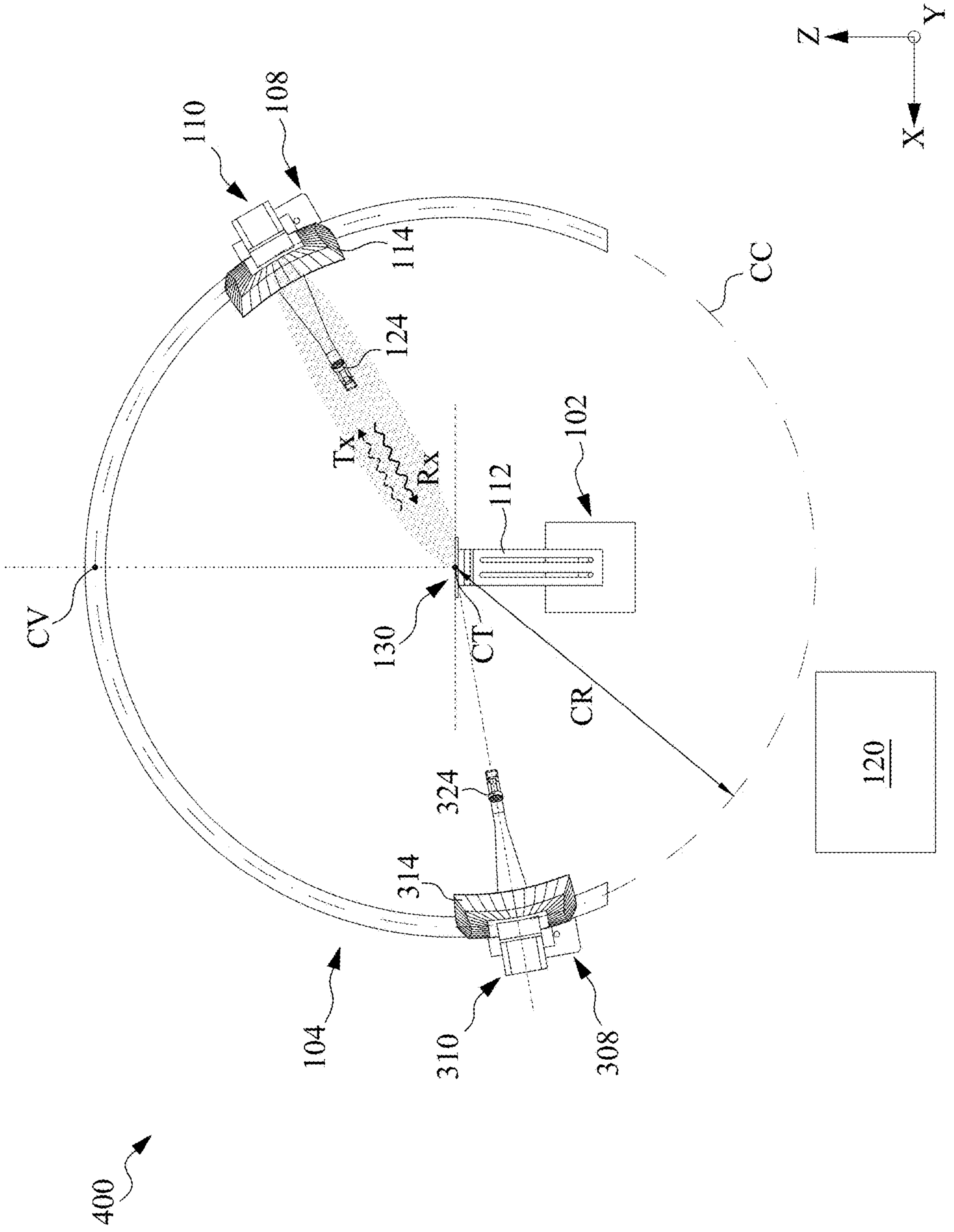
FIG. 4 is a perspective view of an RFSPM system, in accordance with some embodiments of the present disclosure.

FIG. 4 is a perspective view of an RFSPM system 400, in accordance with some embodiments of the present disclosure. In some embodiments, the RFSPM system 400 is applicable to measurement of the gain/phase pattern of the DUT 130 for more than one signal transmitters in the move to determine the beamforming and beam-tracking capability of a DUT 130. For example, the reflectors 110 and 310 are used to emulate the movements of low earth orbit (LEO) satellites over the sky, and the DUT 130 is used to emulate the beamforming and beam-tracking capability of a ground station on the earth to track more than one LEO satellite on the LEO at the same time and determine which LEO satellite would be selected and tracked by the ground station.

Referring to FIG. 4, before or at the beginning of the measurement operation, the DUT 130 is disposed on the track 112 of the stage 102. The track 112 is configured to carry and fix the DUT 130 on the stage 102 in a way similar to that described with reference to FIG. 1B. Further, each of the reflectors 110 and 310 and the DUT 130 is electrically connected to the transceiver 120, e.g., through a cable, a wire, or any other suitable connecting medium, to receive or transmit the testing RF signal. After the components of the RFSPM system 400 are arranged in place, the measurement operation is started.

During operation, the reflectors 110 and 310 are configured to move along the sliding track 104 and follow the predetermined path of the hypothetical circle CC in a predetermined speed. The reflectors 110 and 310 may be spaced apart by a predetermined distance on the sliding track 104. In some embodiments, the reflectors 110 and 310 are configured to move on the sliding track 104 in a same direction to emulate the actual orbital evolution of the LEO satellites. Each of the reflectors 110 and 310 are configured to transmit respective testing RF signals to the DUT 130 at the same time, and the DUT 130 may receive more than one RF signals with different gains and phases at the same or different times. Further, the DUT 130 may possess beamforming and beam-tracking capability to track at least one incident RF signal at one time. The measurement operation may be carried out by determining whether the DUT 130 can successfully select the reflector 110 or 310 that has a stronger received signal gain among the reflectors 110 and 310. The measurement operation may be carried out further by determining whether the DUT 130 can successfully switch between the reflectors 110 and 310 when the intensity order of the receive signal gains from the reflectors 110 and 130 has changed. Moreover, the measurement operation may be carried out further by determining how much time does the DUT 130 need to complete the reflector switch, and how much time does DUT 130 lose track of both the reflectors 110 and 310, to evaluate the transition time during which the communication is unavailable.

The proposed RFSPM system 400 provides advantages. Existing measurement systems can only provide measurement and calibration functions of beamforming and beam-tracking with only a single target (e.g., one single reflector emulating one LEO satellite). Therefore, the real beamforming and beam-tracking performance of the DUT 130 given multiple reflectors cannot be assessed thoroughly during the testing phase. In contrast, the propose RFSPM system 400 can support the scenario of multiple reflectors that emulate the multiple LEO satellites showing up at the same time. As a result, the beamforming and beam-tracking capability of the DUT 130 can be assessed more thoroughly.

Figure 5A:
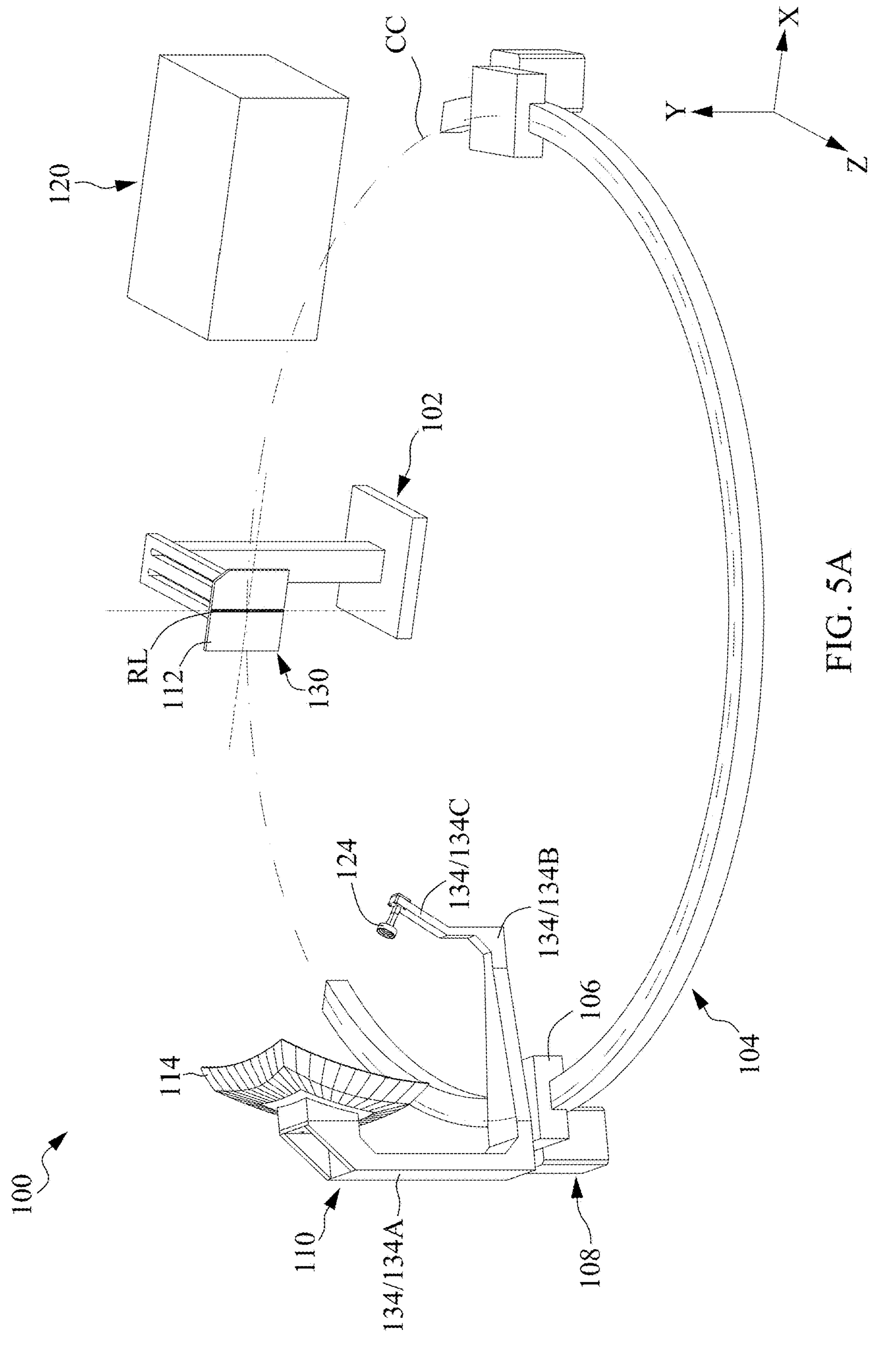
FIGS. 5A, 5B and 5C are perspective views of different stages of operating an RFSPM system, in accordance with some embodiments of the present disclosure.
Figure 5B:
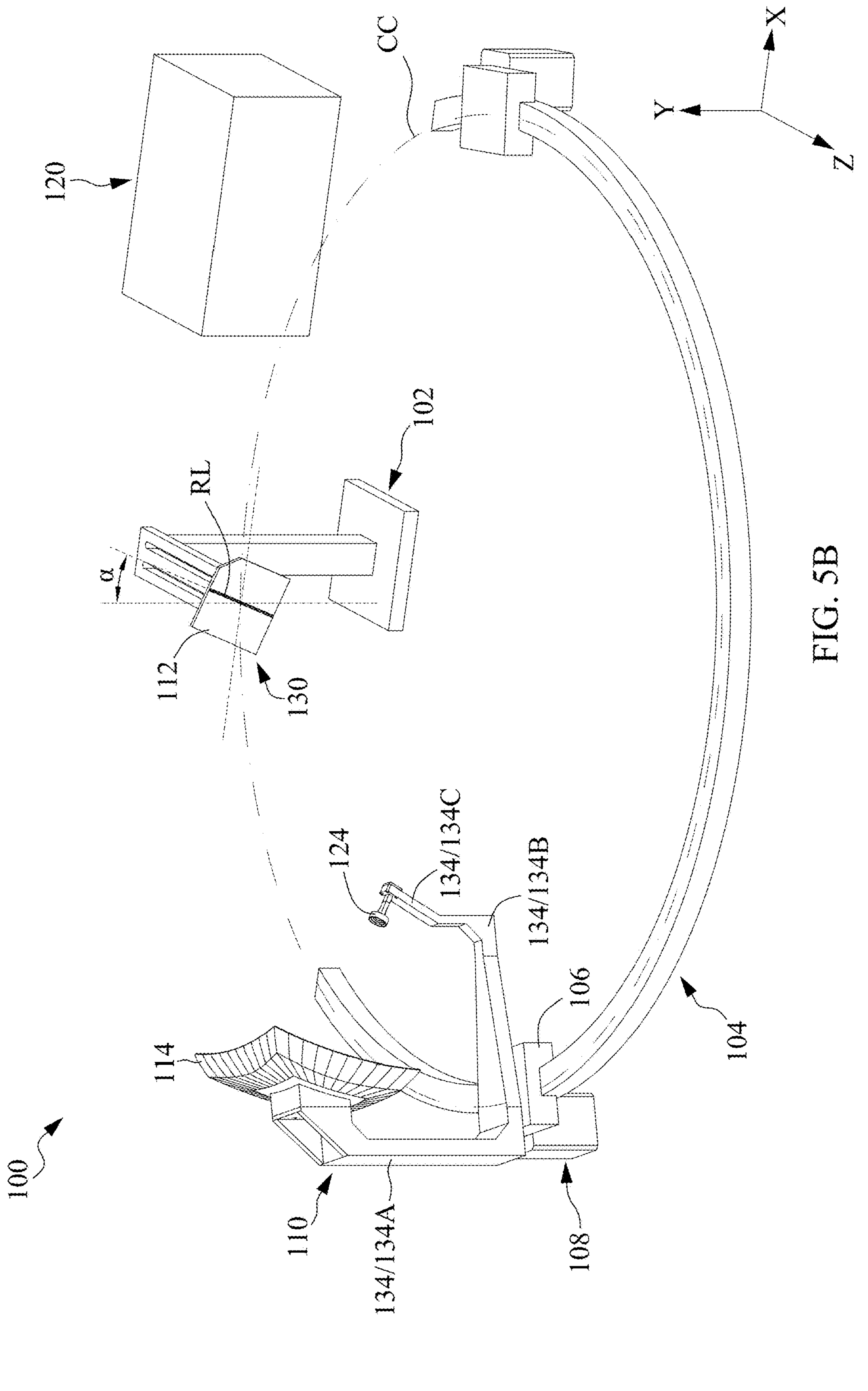
Figure 5C:
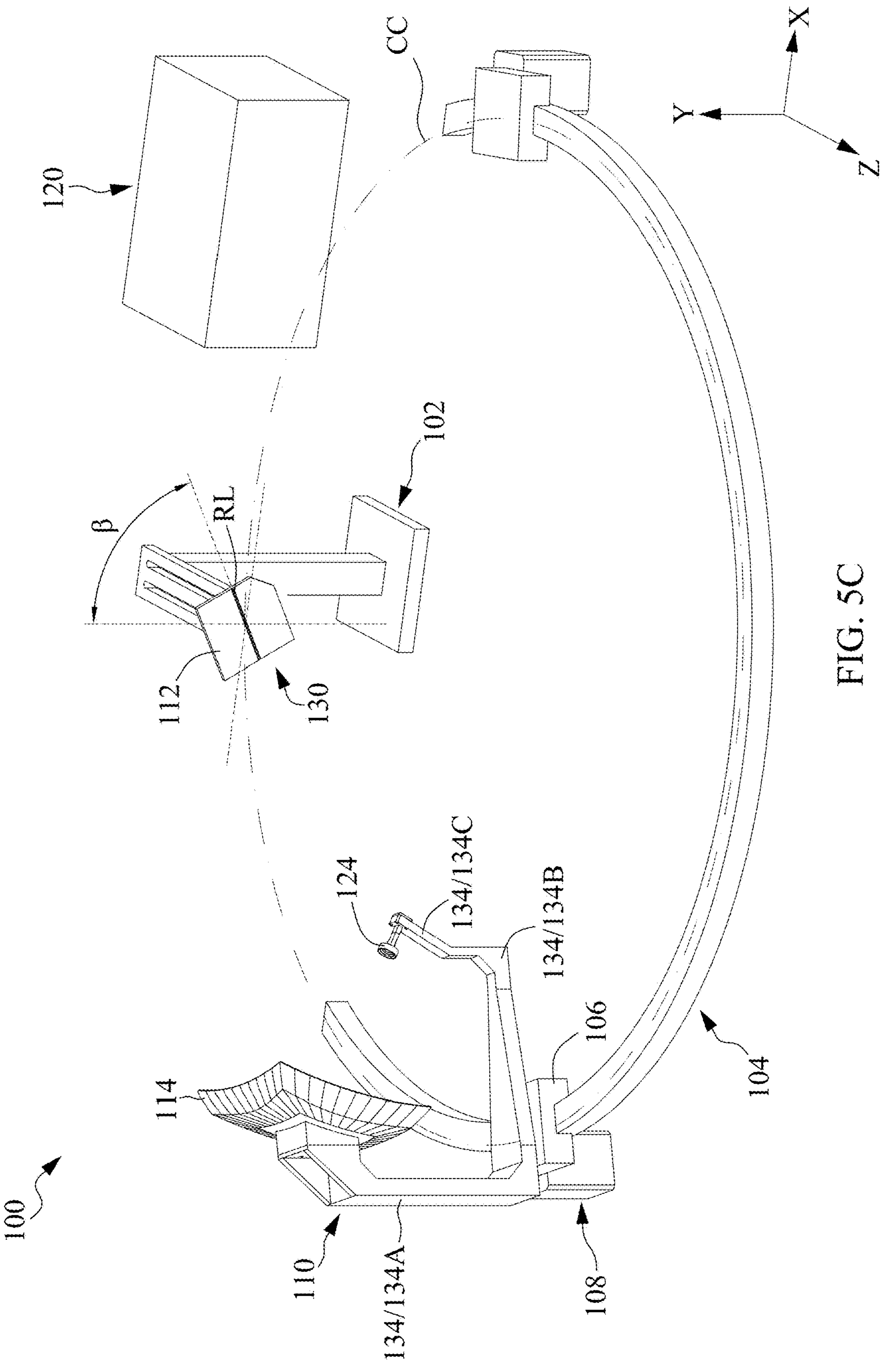

FIGS. 5A, 5B and 5C are perspective views of different stages of operating the RFSPM system 100, in accordance with some embodiments of the present disclosure. In some embodiments, the RFSPM system 100 is applicable to measuring the RF signal antenna gain/phase pattern in a three-dimensional (3D) manner. As discussed previously with reference to FIG. 1C, the one-dimensional (1D) gain pattern 101 (the phase pattern also applies) taken in the XZ-plane acquired by the RFSPM system 100 or 300 represents a cross-sectional snapshot of the entire 3D gain pattern along the XZ-plane. If one would like to achieve the goal of acquiring the comprehensive 3D gain/phase pattern, the most efficient way is to perform multiple 1D measurement operations to acquire multiple 1D gain/phase patterns (similar to the gain pattern 101) along different sectional planes, in which the different sectional planes are taken by rotating the hypothetical circle CC about the Z-axis. That is equivalent to rotating the target surface of the DUT 130 by different rotational angles on a rotational plane, i.e., the XY-plane, and performing multiple signal pattern measurements on the original XZ-plane for the different rotational angles, in which the XY-plane is perpendicular to the Z-axis, which overlaps the center CT and the vertex CV.

Referring to FIG. 5A, a first measurement operation is performed. Through the first measurement operation, a 1D gain/phase pattern of the testing RF signal is acquired. The testing setup associated with the first measurement operation shown in FIG. 5A is similar to that shown in FIGS. 1A and 1B. Further, before the first measurement operation is performed, the DUT 130 is rotated on the XY-plane by a rotational angle of substantially zero degrees, which is an included angle measured between a rotational line RL of the DUT 130 and the Y-axis. In other words, the rotational line RL is parallel to or overlaps the Y-axis. In some embodiments, the rotational line RL is a hypothetical line on the target surface of the DUT 130 and may be parallel to one edge of the DUT 130. The signal gain/phase pattern is measured on the XZ-plane.

Referring to FIG. 5B, a second measurement operation is performed. Through the second measurement operation, another 1D gain/phase pattern of the testing RF signal is acquired. The testing setup associated with the second measurement operation shown in FIG. 5B is similar to that shown in FIGS. 1A and 1B or 5A. Further, before the second measurement operation is performed, the DUT 130 is rotated on the XY-plane by a rotational angle $\alpha$, which is an included angle measured between the rotational line RL of the DUT 130 and the Y-axis. In other words, the rotational line RL is rotated clockwise by an angle $\alpha$ on the XY-plane. The signal gain/phase pattern is measured on the XZ-plane.

Referring to FIG. 5C, a third measurement operation is performed. Through the third measurement operation, yet another 1D gain/phase pattern of the testing RF signal is acquired. The testing setup associated with the third measurement operation shown in FIG. 5C is similar to that shown in FIGS. 1A and 1B, 5A or 5B. Further, before the third measurement operation is performed, the DUT 130 is rotated on the XY-plane by a rotational angle $\beta$, which is an included angle measured between the rotational line RL of the DUT 130 and the Y-axis. In other words, the rotational line RL is rotated clockwise by an angle $\beta$ on the XY-plane. The signal gain/phase pattern is measured on the XZ-plane.

The measurement operation can be repeated as many times as desirable until the resolution meets the requirements of the 3D gain/phase pattern. Further, the same measurement procedure for acquiring a 3D gain/phase pattern can also be applied to measurement of a reflective gain/phase pattern with reference to FIGS. 3A to 3C.

Figure 6A:
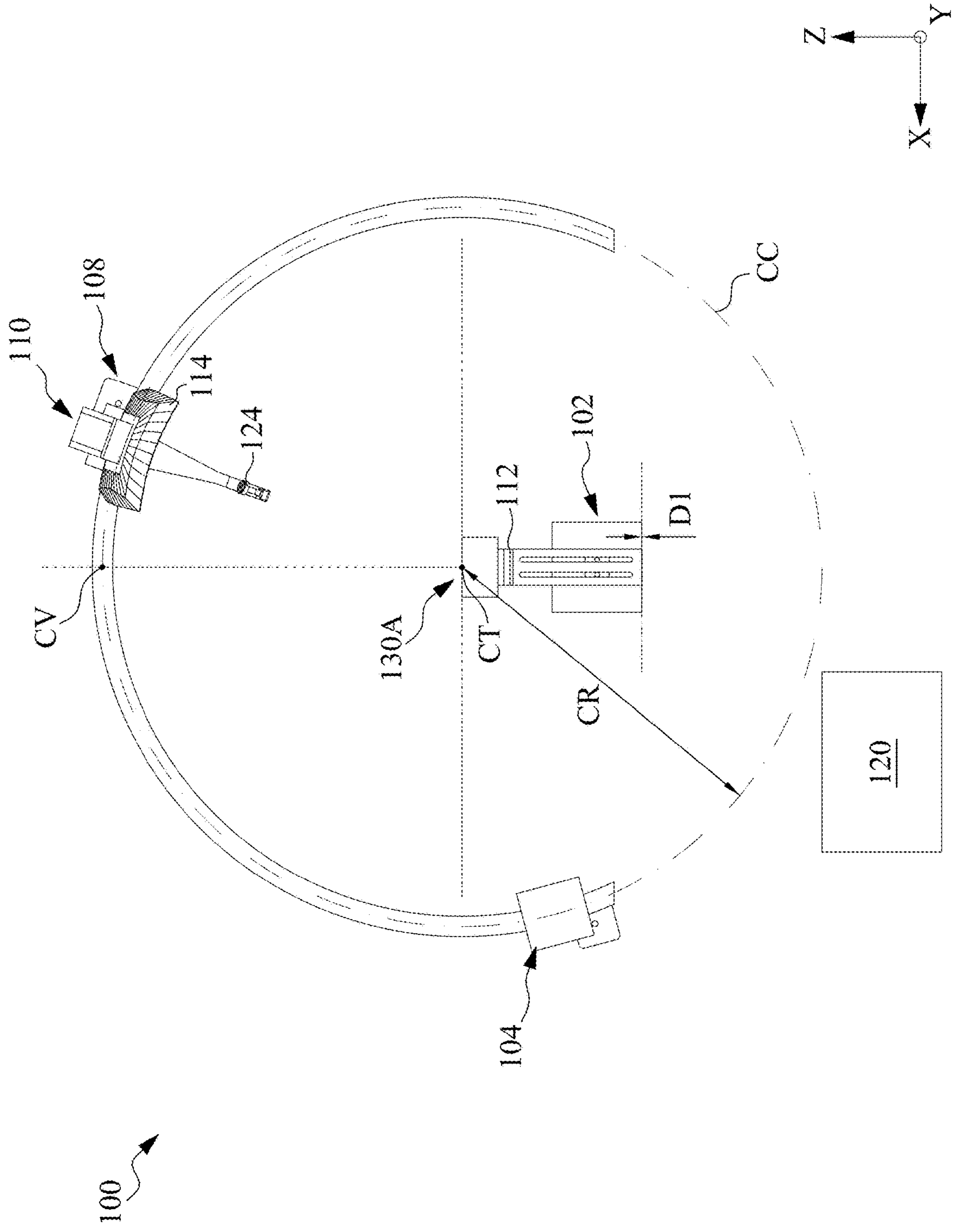
FIGS. 6A, 6B and 6C are top views of different modes of operating an RFSPM system, in accordance with some embodiments of the present disclosure.
Figure 6B:
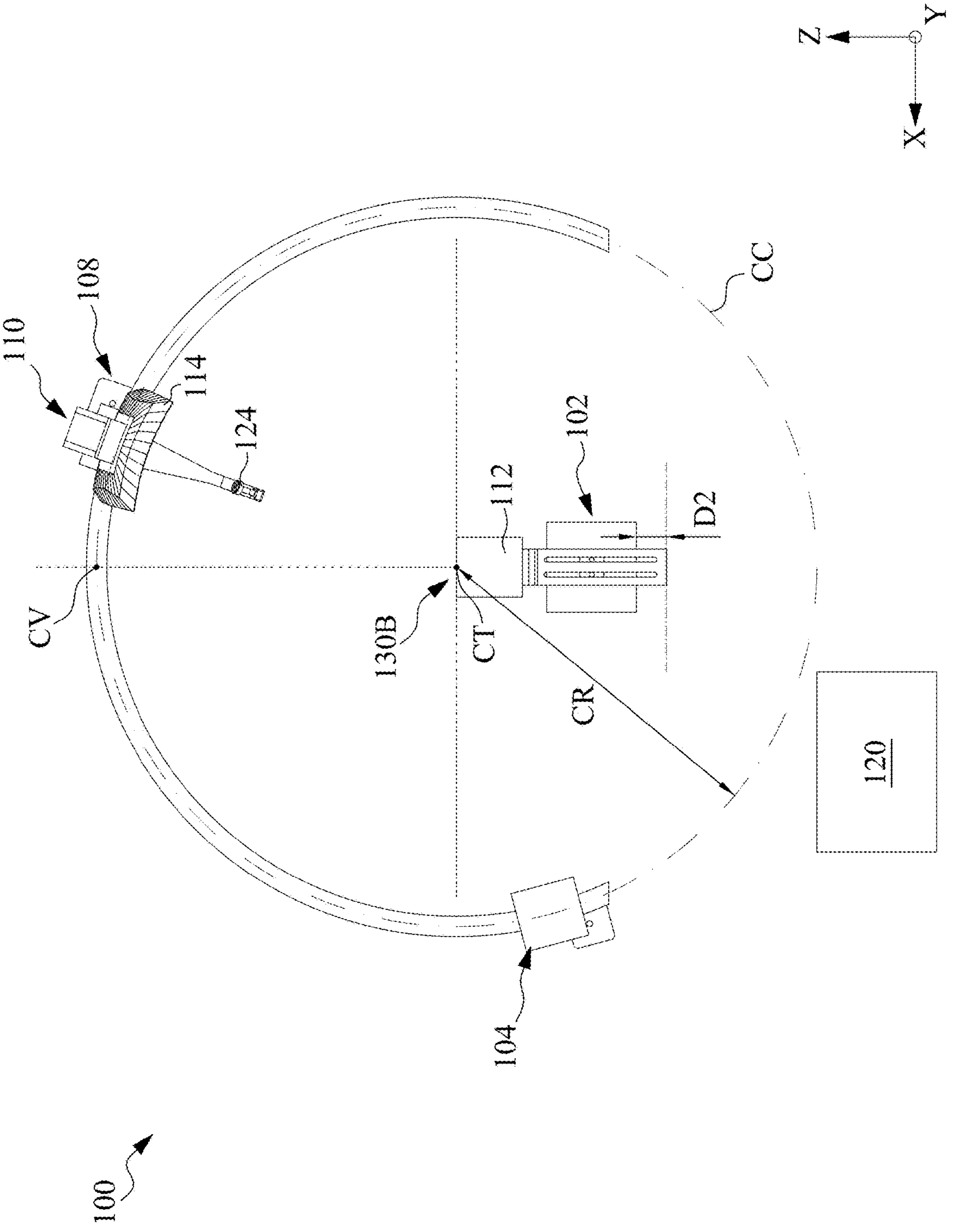
Figure 6C:
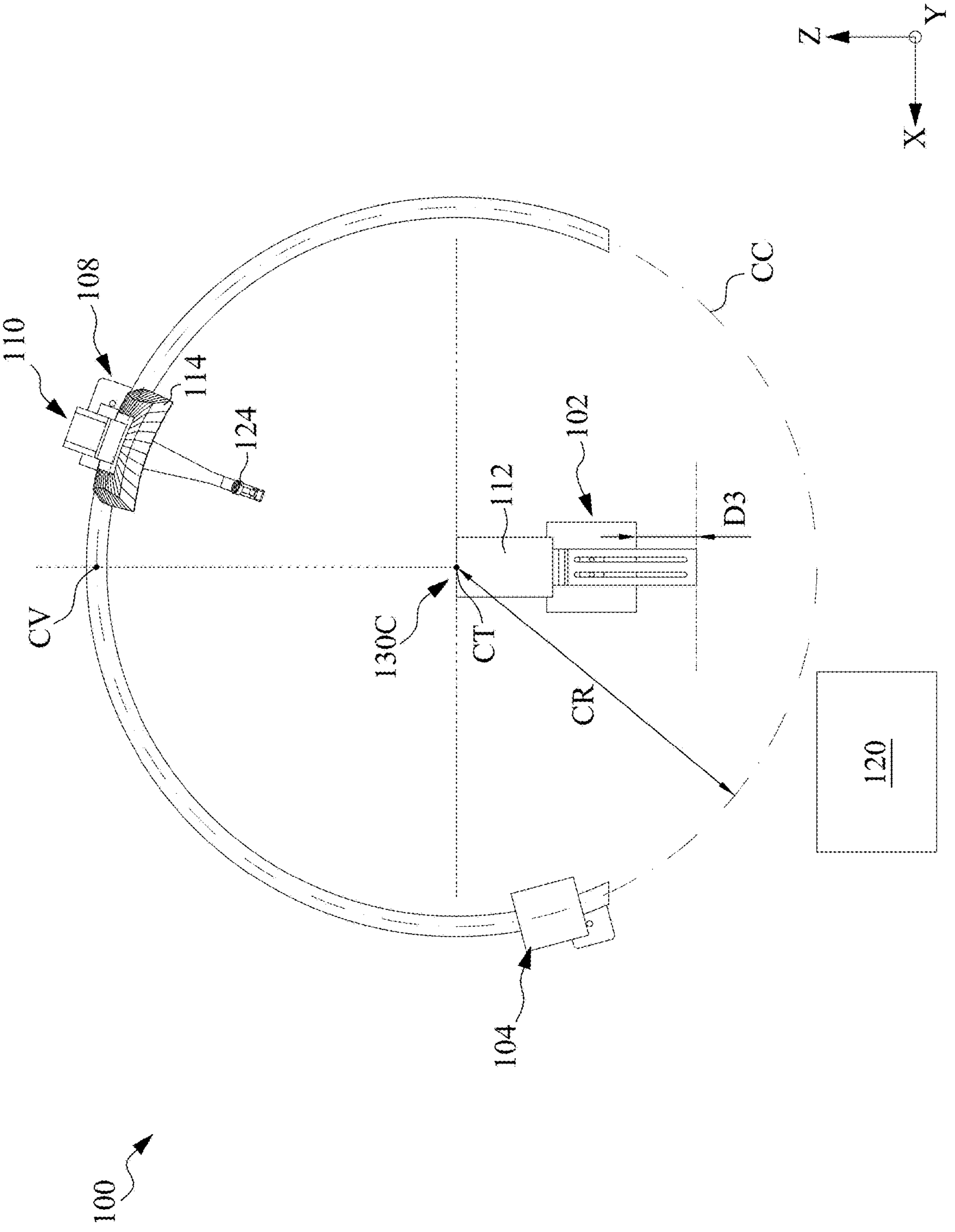

FIGS. 6A, 6B and 6C are top views of different modes of operating the RFSPM system 100, in accordance with some embodiments of the present disclosure. In some embodiments, the RFSPM system 100 is applicable to measuring the RF signal antenna gain/phase pattern with the position of the DUT 130 in the correct location. As discussed previously with reference to FIG. 1B, the target surface of the DUT 130 is to be aligned with or pass through the center CT of the hypothetical circle CC. That would guarantee the testing RF signal to be transmitted, received or reflected punctually at the center CT, thereby simplifying the calculation of the incident angle, the reflection angle, and the like. However, since the various DUTs 130 containing the target surface may not have identical sizes, and the stage 102 is fixed without a moving capability, there might be a situation that the target surface of the DUT 130 is not aligned with or passing through the center CT of the hypothetical circle CC when the DUT 130 is directly attached to the stage 102.

To address the abovementioned issue, the track 112 is introduced to be movably attached to the stage 102 and the DUT 130. The track 112 is configured to move along the Z-axis pointing to the vertex CV of the hypothetical circle CC. The track 112 can thus be adapted to the different sizes of the DUT 130 such that the target surface of the DUT 130 can be precisely aligned with or passing through the center CT.

Referring to FIG. 6A, a DUT 130A is disposed on the track 112. The DUT 130A has a body attached to the track 112 and a target surface facing the reflector 110. The target surface of the DUT 130A is arranged to be aligned with the center CT and parallel to the X-axis. In some embodiments, the DUT 130A has a relatively small dimension in the Z-axis such that the track 112 should be adapted to move the DUT 130A as forward as possible. As a result, a rear side of the track 112 distal to the center CT is substantially aligned with a rear side of the stage 102 distal to the center CT. A distance D1 between the rear side of the track 112 and the rear side of the stage 102 is substantially zero.

Referring to FIG. 6B, a DUT 130B is disposed on the track 112. The DUT 130B has a body attached to the track 112 and a target surface facing the reflector 110. The target surface of the DUT 130B is arranged to be aligned with the center CT and parallel to the X-axis. In some embodiments, the DUT 130B has a medium dimension in the Z-axis such that the track 112 is adapted to move the DUT 130B with part of the track 112 extending beyond the rear side of the stage 102. As a result, a rear side of the track 112 distal to the center CT extends past a rear side of the stage 102 distal to the center CT. A distance D2 between the rear side of the track 112 and the rear side of the stage 102 is greater than the distance D1.

Referring to FIG. 6C, a DUT 130C is disposed on the track 112. The DUT 130C has a body attached to the track 112 and a target surface facing the reflector 110. The target surface of the DUT 130C is arranged to be aligned with the center CT and parallel to the X-axis. In some embodiments, the DUT 130C has a relatively large dimension in the Z-axis such that the track 112 should be adapted to move the DUT 130C as backward as possible. As a result, a rear side of the track 112 distal to the center CT extends more past a rear side of the stage 102 distal to the center CT as compared to the track 112 shown in FIG. 6B. A distance D3 formed between the rear side of the track 112 and the rear side of the stage 102 is greater than the distance D1 or D2.

Figure 7A:
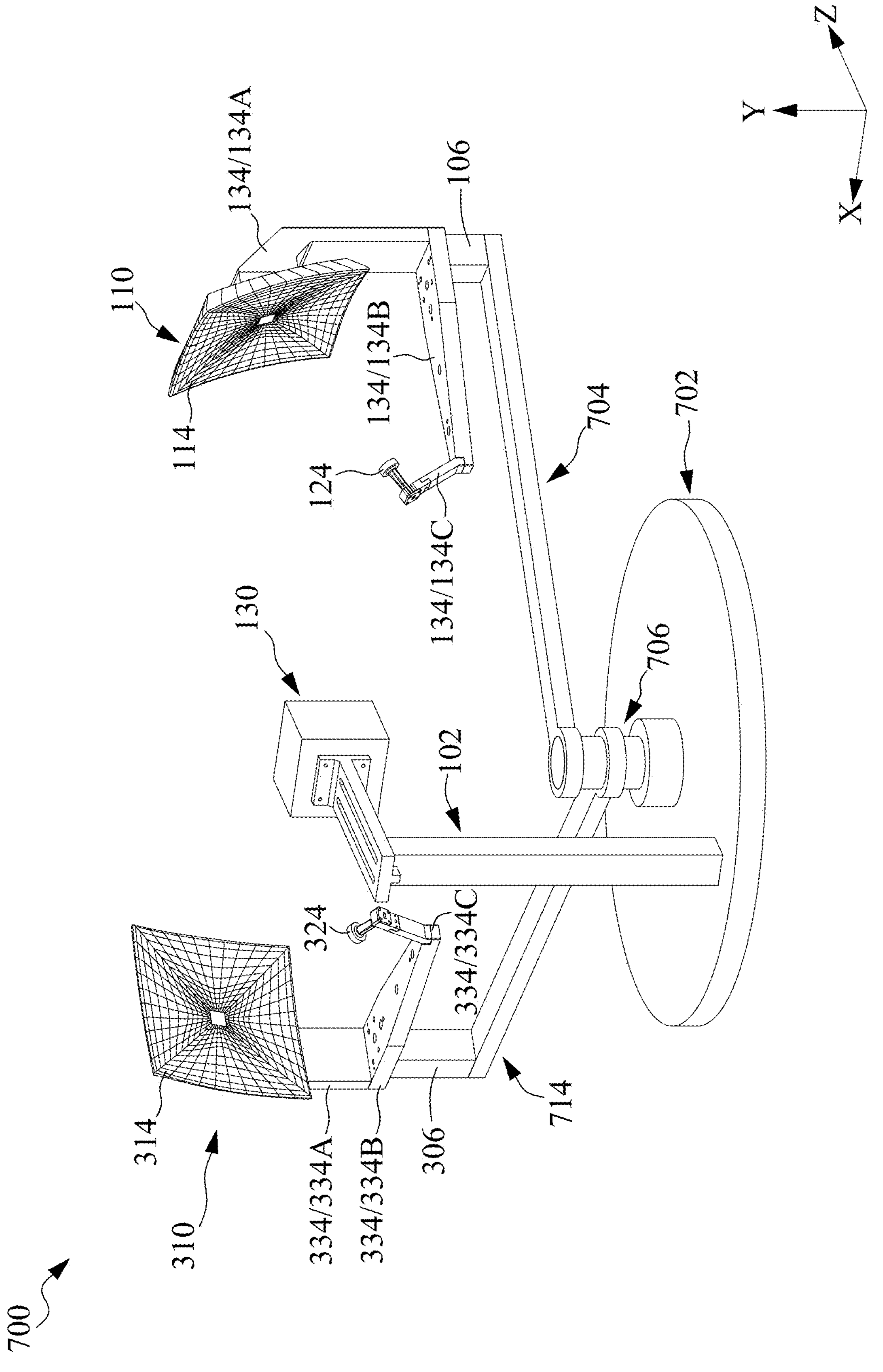
FIG. 7A is a perspective view of an RFSPM system, in accordance with some embodiments of the present disclosure.
Figure 7B:
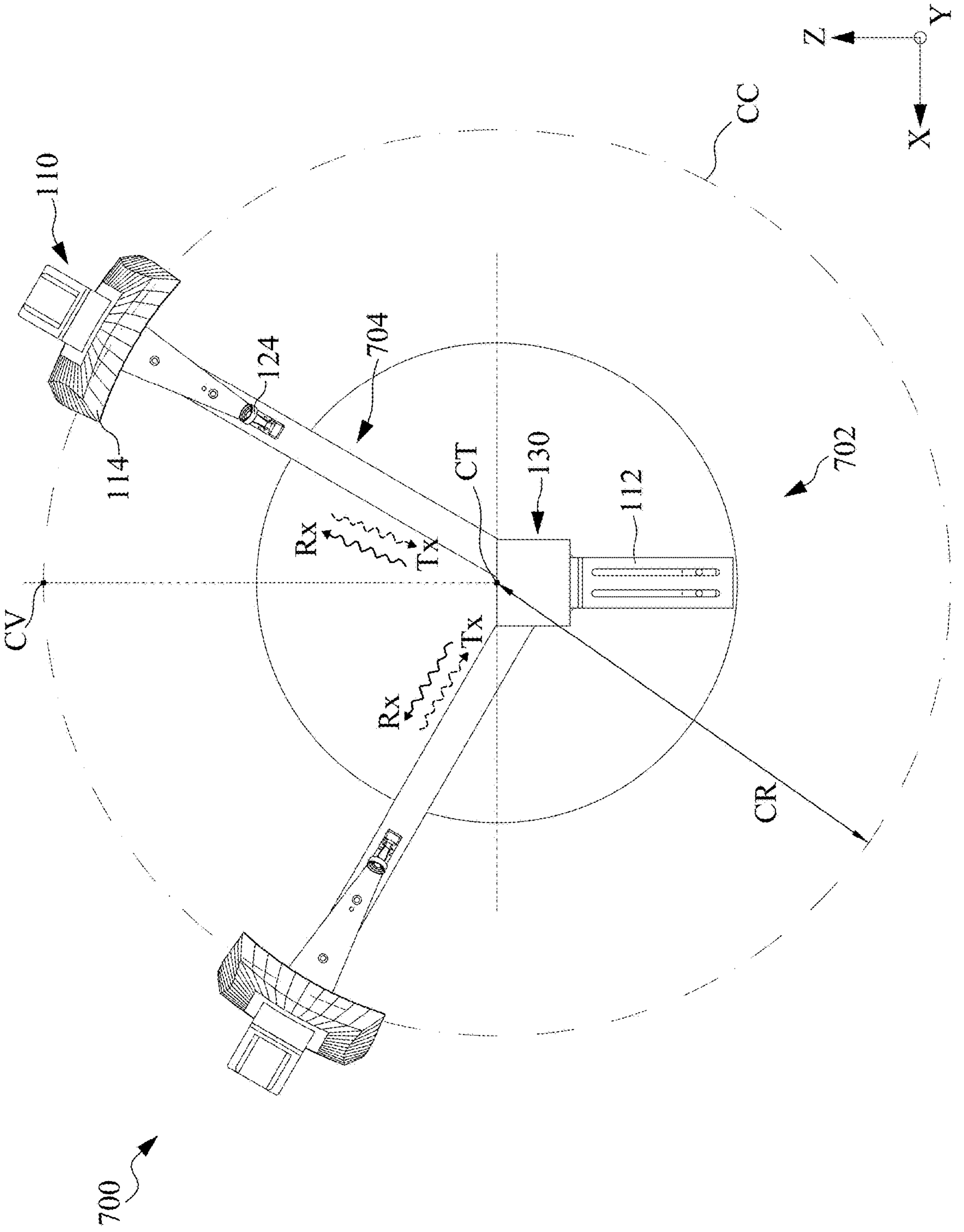
FIGS. 7B and 7C are an elevation view and a top view, respectively, of the RFSPM system shown in FIG. 7A, in accordance with some embodiments of the present disclosure.
Figure 7C:
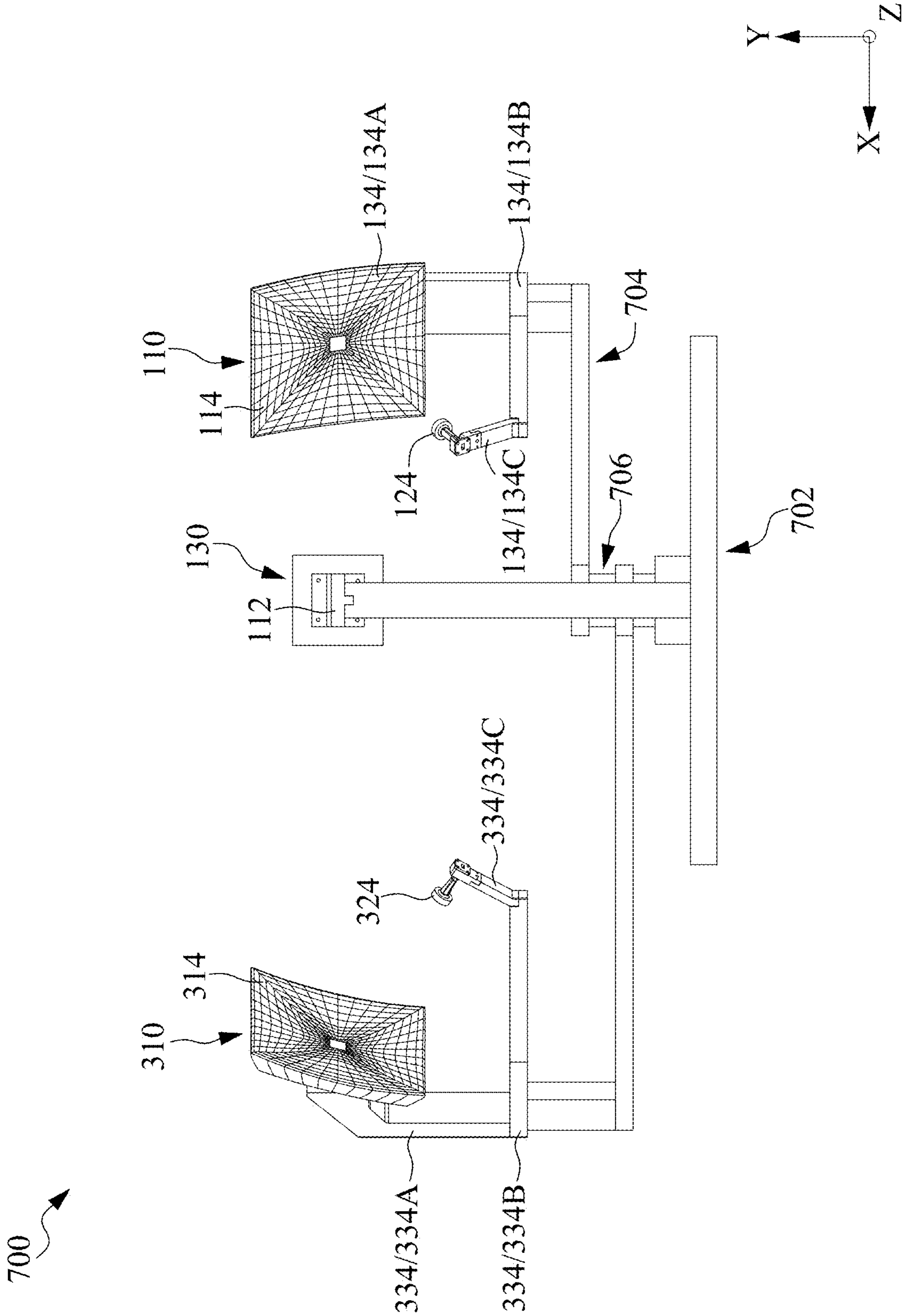

FIG. 7A is a perspective view of an RFSPM system 700, in accordance with some embodiments of the present disclosure. FIGS. 7B and 7C are a top view and an elevation view, respectively, of the RFSPM system 700 shown in FIG. 7A, in accordance with some embodiments of the present disclosure. The RFSPM system 700 is similar to the RFSPM system 100 or 300 in many aspects, and similar features are not repeated for brevity. The major difference between the RFSPM system 700 and the RFSPM system 100 or 300 is that the RFSPM system 700 includes a stage 702 including a pivot 706 in place of the stage 102. The RFSPM system 700 further includes a cantilever 704 and a cantilever 714 pivotally coupled to the stage 702 through the pivot 706. In some embodiments, the stage 702, the pivot 706 and the cantilevers 704 and 714 are used to replace the stage 102 and the sliding track 104 of the RFSPM system 100 or 300.

Referring to FIGS. 7A and 7C, in some embodiments, the cantilever 704 is connected between the pivot 706 and the reflector 110, and the cantilever 714 is connected between the pivot 706 and the reflector 310. The cantilever 704 or 714 may have ring shape at one end fitting a post of the pivot 706 and configured to rotate about the post of the pivot 706 on the XZ-plane. In some embodiments, the length of the cantilever 704 is equal to the length of the cantilever 714, and the length of the cantilever 704 or 714 is equal to the radius CR of the hypothetical circle CC. Therefore, the reflectors 110 and 310 are moved by rotations of the corresponding cantilevers 704 and 714 along the circular path of the perimeter of the hypothetical circle CC. Throughout the present disclosure, the cantilevers 704 and 714 are referred to as another kind of the "path-guiding member" since they serve the same function as the sliding track 104 in moving the reflectors 110 and 310 to follow the circular path of the perimeter of the hypothetical circle CC.

Figure 8:
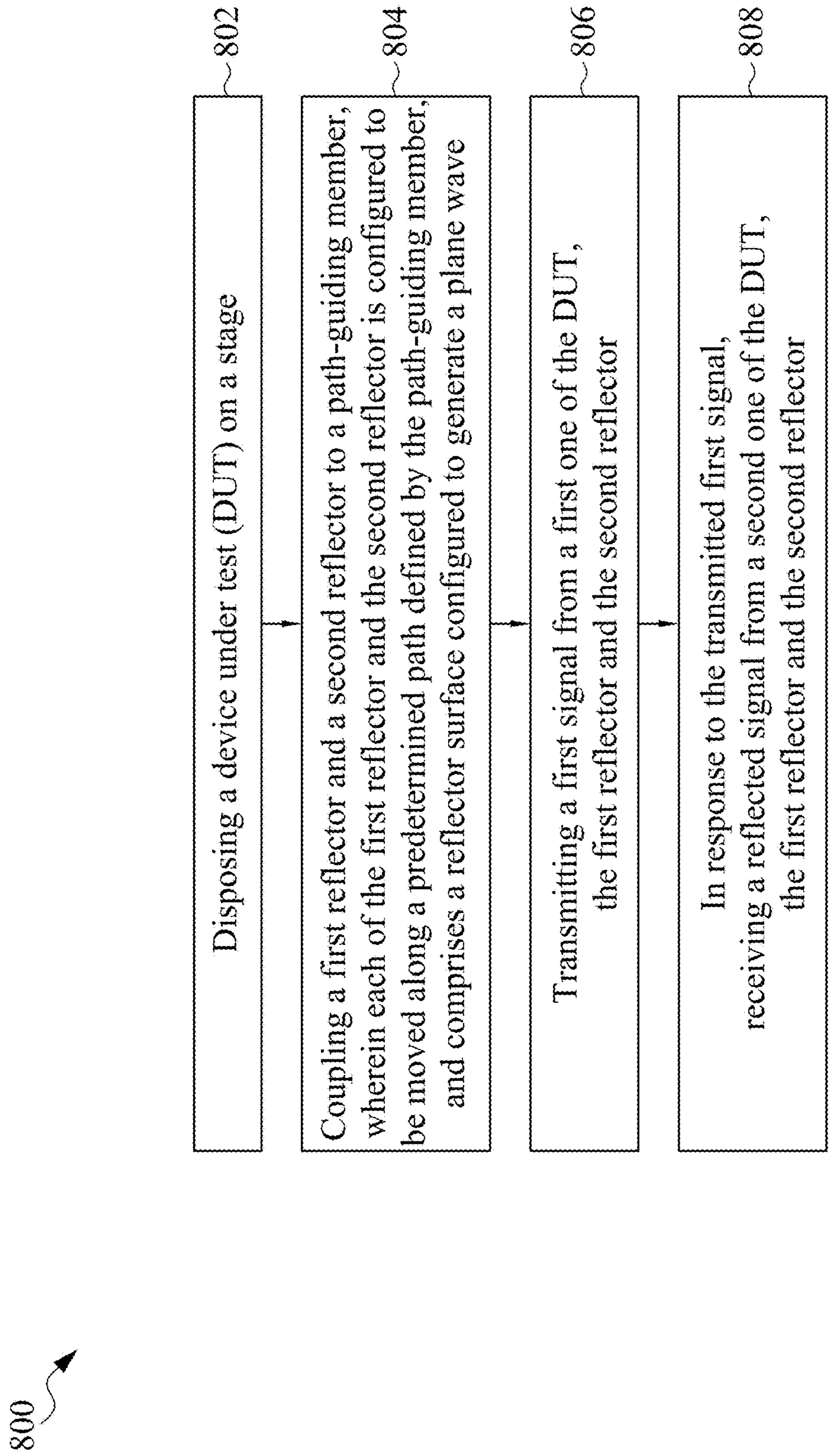
FIG. 8 is a schematic flowchart of a method of operating an RFSPM system, in accordance with some embodiments of the present disclosure.

FIG. 8 is a schematic flowchart of a method 800 of operating an RFSPM measurement system, in accordance with some embodiments of the present disclosure. It should be understood that additional steps can be provided before, during, and after the stages shown in FIG. 8, and some of the steps described below can be replaced or eliminated in other embodiments of the method shown in FIG. 8. The order of the steps may be changed as needed for different embodiments of the present disclosure.

At step 802, a device under test (DUT) is disposed on a stage.

At step 804, a first reflector and a second reflector are coupled to a path-guiding member. In some embodiments, each of the first reflector and the second reflector is configured to be moved along a predetermined path defined by the path-guiding member, and comprises a reflector surface configured to generate a plane wave.

At step 806, a first signal is transmitted from a first one of the DUT, the first reflector and the second reflector.

At step 808, in response to the transmitted first signal, a reflected signal is received from a second one of the DUT, the first reflector and the second reflector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for measuring a signal pattern, comprising:
a first reflector comprising a first reflector surface configured to generate a plane wave;
a second reflector comprising a second reflector surface configured to generate a plane wave;
a path-guiding member coupled to the first reflector and the second reflector, and configured to move the first reflector and the second reflector along a predetermined path;
a stage configured to hold a device under test (DUT), the DUT having a surface; and
a transceiver configured to transmit a first signal to one of the first reflector and the second reflector, and receive the first signal reflected by the surface of the DUT from the other one of the first reflector and the second reflector.

2. The system of claim 1, further comprising:
a first signal emitter/receiver disposed on a first one of the first reflector, the second reflector and the DUT, and electrically coupled to the transceiver; and
a second signal emitter/receiver disposed on a second one of the first reflector, the second reflector and the DUT, and electrically coupled to the transceiver,
wherein the transceiver is further configured to transmit a second signal to, or receive the second signal from, at least one of the first reflector, the second reflector and the DUT,
wherein the first signal emitter/receiver and the second signal emitter/receiver are configured to respectively transmit the second signal and receive the second signal in response to the transmitted second signal.

3. The system of claim 1, wherein the transceiver is further configured to transmit the first signal between the first reflector and the second reflector through the DUT.

4. The system of claim 3, wherein the first reflector is configured to transmit the first signal with an incident angle, and the second reflector is configured to receive a reflected signal with a reflection angle equal to the incident angle.

5. The system of claim 3, wherein the first reflector is configured to transmit the first signal with an incident angle, and the second reflector is configured to receive a reflected signal with a reflection angle unequal to the incident angle.

6. The system of claim 1, wherein the path-guiding member defines a circle and a center of the circle, wherein a reflection direction of the first reflector surface or the second reflector surface is configured to point to the center during movement of the first reflector or the second reflector by the path-guiding member.

7. The system of claim 6, wherein the path-guiding member further defines a first axis located on the circle and passes through the center of the circle, and the surface passes through the center of the circle, wherein the stage is configured to rotate the surface of the DUT around the first axis with different rotational angles,
wherein the transceiver is further configured to transmit the first signal to the one of the first reflector and the second reflector, and receive the first signal reflected by the surface of the DUT from the other one of the first reflector and the second reflector regarding a first one of the different rotational angles to generate a one-dimensional (1D) gain pattern and a 1D phase pattern for the first one of the different rotational angles, and assemble a three-dimensional (3D) gain pattern and a 3D phase pattern by generating a plurality of the 1D gain patterns and a plurality of the 1D phase patterns corresponding to each of the different rotational angles including the first one of the different rotational angles.

8. The system of claim 6, wherein the stage comprises a track configured to move the DUT along an axis passing the center of the circle.

9. The system of claim 1, wherein the path-guiding member is a cantilever coupled between the stage and the first reflector.

10. The system of claim 1, wherein the path-guiding member is a sliding track including a shape of an arc following a perimeter of a circle defined by the predetermined path.

11. A method for measuring a signal pattern, the method comprising:
disposing a device under test (DUT) on a stage, the DUT having a surface;
coupling a first reflector and a second reflector to a path-guiding member, wherein each of the first reflector and the second reflector is configured to be moved along a predetermined path defined by the path-guiding member, and comprises a reflector surface configured to generate a plane wave;
transmitting a first signal from one of the first reflector and the second reflector; and
in response to the transmitted first signal, causing reflection of the first signal from the surface of the DUT and reception of the first signal from the other one of the first reflector and the second reflector.

12. The method of claim 11, wherein the first signal is transmitted between the first reflector and the second reflector through the DUT.

13. The method of claim 12, wherein the transmitting of the first signal causes a specular reflection between the first reflector and the second reflector through the DUT.

14. The method of claim 12, wherein the transmitting of the first signal causes a scattering reflection between the first reflector and the second reflector through the DUT.

15. The method of claim 11, wherein the path-guiding member defines a circle, a center of the circle and a first axis located on the circle and passes through the center of the circle, and the surface passes through the center of the circle, wherein the disposing of the DUT on the stage comprises rotating the surface of the DUT around the first axis with different rotational angles, wherein the method further comprises transmitting the first signal to the one of the first reflector and the second reflector and receiving the first signal reflected by the surface of the DUT from the other one of the first reflector and the second reflector corresponding to a first one of the different rotational angles to generate a 1D gain pattern and a 1D phase pattern corresponding to the first one of the different rotational angles, and assembling a 3D gain pattern and a 3D phase pattern by generating a plurality of the 1D gain patterns and a plurality of the 1D phase patterns corresponding to the different rotational angles including the first one of the different rotational angles.

16. The method of claim 11, further comprising transmitting a second signal by one of the first reflector and the second reflector and receiving the second signal by the DUT, or transmitting the second signal by the DUT and receiving the second signal by one of the first reflector and the second reflector.

17. The method of claim 11, wherein the transmitting of the first signal causes the first signal to be transmitted from the first reflector, through the DUT and received by the first reflector.

18. The method of claim 11, further comprising transmitting a third signal and a fourth signal such that the third signal and the fourth signal are transmitted from the respective first reflector and the second reflector at the same time and received by the DUT.

19. The method of claim 11, further comprising generating the first signal by a signal transceiver and transmitting the first signal to one of the first reflector and the second reflector.

20. The method of claim 11, wherein the path-guiding member is a cantilever coupled between the stage and one of the first reflector and the second reflector, and configured to move the one of the first reflector and the second reflector along the predetermined path.

* * * * *